United States Patent
Bazarsky et al.

(10) Patent No.: US 11,430,531 B2
(45) Date of Patent: Aug. 30, 2022

(54) READ INTEGRATION TIME CALIBRATION FOR NON-VOLATILE STORAGE

(71) Applicant: Western Digital Technologies, Inc., San Jose, CA (US)

(72) Inventors: Alexander Bazarsky, Holon (IL); David Rozman, Kiryat Malakhi (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/171,637

(22) Filed: Feb. 9, 2021

(65) Prior Publication Data

US 2022/0076738 A1 Mar. 10, 2022

Related U.S. Application Data

(60) Provisional application No. 63/075,599, filed on Sep. 8, 2020.

(51) Int. Cl.
*G11C 7/22* (2006.01)
*G11C 16/34* (2006.01)
*G11C 16/26* (2006.01)
*G11C 11/56* (2006.01)
*G11C 16/04* (2006.01)
*G11C 16/10* (2006.01)

(52) U.S. Cl.
CPC ...... *G11C 16/3459* (2013.01); *G11C 11/5642* (2013.01); *G11C 16/0483* (2013.01); *G11C 16/10* (2013.01); *G11C 16/26* (2013.01); *G11C 16/3418* (2013.01); *G11C 16/3436* (2013.01); *G11C 2207/2254* (2013.01); *G11C 2207/2281* (2013.01)

(58) Field of Classification Search
CPC . G11C 16/0483; G11C 16/26; G11C 16/3418; G11C 16/3436; G11C 2207/2254; G11C 2207/2281
See application file for complete search history.

(56) References Cited

U.S. PATENT DOCUMENTS

| | | | |
|---|---|---|---|
| 6,728,141 | B2 | 4/2004 | Micheloni et al. |
| 7,755,946 | B2 | 7/2010 | Dunga et al. |
| 8,942,047 | B2 | 1/2015 | Mui et al. |

(Continued)

FOREIGN PATENT DOCUMENTS

| | | |
|---|---|---|
| JP | 2014044791 A | 3/2014 |
| JP | 2014157650 A | 8/2014 |
| JP | 2017084436 A | 5/2017 |

*Primary Examiner* — Mushfique Siddique
(74) *Attorney, Agent, or Firm* — Vierra Magen Marcus LLP

(57) ABSTRACT

Read reference levels are calibrated by calibrating integration times. An integration time is the length of time for which the charge on a sense node is allowed to change while the memory cell is being sensed. Calibrating the integration time is much faster than calibrating the reference voltage itself. This is due, in part, to reducing the number of different reference voltages that need to be applied during calibration. Calibrating the integration time may use different test integration times for a given read reference voltage, thereby reducing the number of read reference voltages. Hence, calibrating the integration time(s) is very efficient timewise. Also, power consumption may be reduced.

15 Claims, 23 Drawing Sheets

(56) References Cited

U.S. PATENT DOCUMENTS

| | | |
|---|---|---|
| 9,070,454 B1 | 6/2015 | Wu et al. |
| 9,530,512 B2 | 12/2016 | Ray et al. |
| 9,697,905 B2 | 7/2017 | Sharon et al. |
| 9,761,308 B1 | 9/2017 | Cometti |
| 10,418,097 B2 | 9/2019 | Avraham et al. |
| 10,446,242 B2 | 10/2019 | Actenberg et al. |
| 10,566,061 B2 | 2/2020 | Karakulak et al. |
| 10,607,561 B2 | 3/2020 | Xiao |
| 10,991,444 B1* | 4/2021 | Bazarsky ............... G11C 29/52 |
| 11,188,268 B1* | 11/2021 | Sharon ................... G11C 5/025 |
| 2010/0296350 A1 | 11/2010 | Kim et al. |
| 2014/0071761 A1 | 3/2014 | Sharon et al. |
| 2017/0068591 A1 | 3/2017 | Tate et al. |
| 2017/0345510 A1* | 11/2017 | Achtenberg ........ G06F 11/1048 |
| 2019/0164599 A1 | 5/2019 | Avraham et al. |
| 2020/0027503 A1 | 1/2020 | Chen et al. |
| 2020/0402553 A1* | 12/2020 | Koh ....................... G11C 16/26 |
| 2021/0383886 A1* | 12/2021 | Alrod ..................... G11C 29/44 |
| 2021/0407613 A1* | 12/2021 | Eliash .................... G11C 29/14 |

* cited by examiner

Sparse parity check matrix H

N=13 variable nodes

|  | v1 | v2 | v3 | v4 | v5 | v6 | v7 | v8 | v9 | v10 | v11 | v12 | v13 |
|---|---|---|---|---|---|---|---|---|---|---|---|---|---|
| cn1 |  | 1 |  | 1 |  |  |  |  |  |  | 1 |  | 1 |
| cn2 | 1 |  |  |  |  | 1 |  |  |  |  |  | 1 |  |
| cn3 |  |  | 1 |  | 1 | 1 |  |  | 1 | 1 |  |  |  |
| cn4 |  | 1 |  |  |  |  |  | 1 |  | 1 |  |  |  |
| cn5 |  |  |  | 1 |  |  | 1 |  |  |  |  | 1 |  |
| cn6 | 1 |  |  | 1 | 1 |  |  | 1 |  |  |  |  |  |
| cn7 |  | 1 |  |  |  |  |  | 1 |  | 1 |  |  | 1 |
| cn8 |  |  |  | 1 |  |  | 1 |  |  | 1 | 1 |  |  |
| cn9 | 1 |  | 1 |  | 1 |  |  |  |  |  |  |  | 1 |
| cn10 |  |  |  |  |  |  | 1 | 1 | 1 | 1 |  |  |  |

M=10 check nodes

Sparse bipartite graph, 392

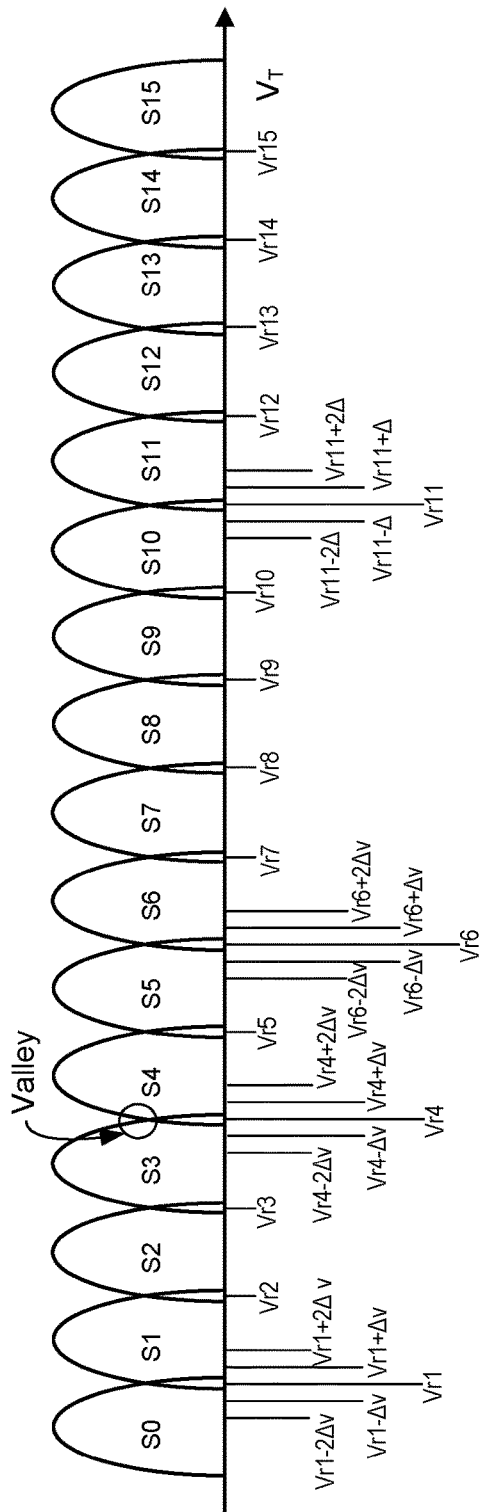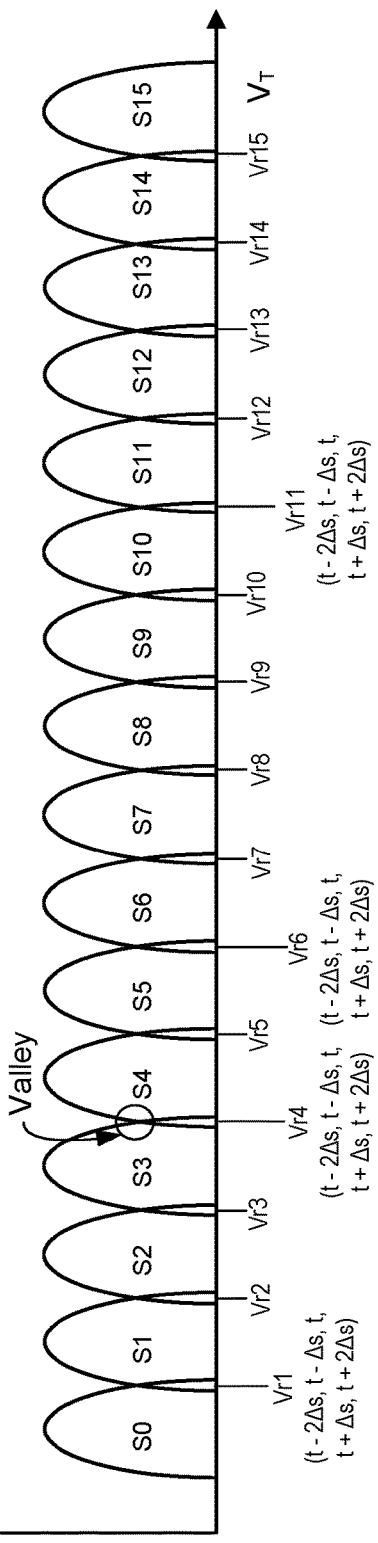

READ INTEGRATION TIME CALIBRATION FOR NON-VOLATILE STORAGE

CLAIM OF PRIORITY

The present application claims priority from U.S. Provisional Patent Application No. 63/075,599, entitled "READ INTEGRATION TIME CALIBRATION FOR NON-VOLATILE STORAGE," by Bazarsky et al., filed Sep. 8, 2020, incorporated by reference herein in its entirety.

BACKGROUND

The strong growth in demand for portable consumer electronic devices is driving the need for high-capacity storage devices. Non-volatile semiconductor memory devices (also referred to herein as "non-volatile storage systems" or "non-volatile memory systems"), such as flash memory, are widely used to meet the ever-growing demands on digital information storage and exchange. Their portability, versatility and rugged design, along with their high reliability and large capacity, have made such memory devices ideal for use in a wide variety of host electronic devices, including for example digital cameras, digital music players, video game consoles, PDAs, cellular telephones, and desktop, laptop, and notepad computers. Typically, the host electronic devices provides power to the non-volatile storage system.

Non-volatile semiconductor storage devices contain non-volatile memory cells that may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. To read the data back from the memory cells it is typical to use read reference voltages in order to determine what data state a memory cell is presently in.

For a variety of reasons, it may be beneficial to modify the read reference voltages over time in order to more accurately sense the data state to which a memory cell was intended to be programmed. One reason for such modifications is that the condition of the memory cells can change between the time that the memory cells were programmed and the time the memory cells were read back. For example, for a memory cell that stores its data state based on a charge stored in the memory cell, there may be charge loss over time. Typically, such charge loss is referred to as a data retention problem. Memory cells may also suffer from program disturb, which refers to a condition (e.g., amount of charge) of the memory cell changing as a result of other memory cells being programmed. Some memory cells may suffer from read disturb, which refers to a condition (e.g., amount of charge) of the memory cell changing as a result of the memory cell being read. Another consideration is that there may be a significant difference in temperature between when the memory cells were programmed and when they are read. Some memory cells are sensitive to such temperature changes. For example, some memory cells contain a transistor, whose threshold voltage indicates the data state. The threshold voltage of a transistor typically depends on temperature.

DESCRIPTION OF THE DRAWINGS

Like-numbered elements refer to common components in the different Figures.

FIG. 8A illustrates example threshold voltage distributions for the memory array when each memory cell stores four bits of data.

FIG. 8B depicts the same Vt distributions depicted in FIG. 8A, but with integration times indicated.

DETAILED DESCRIPTION

Figure 1A:
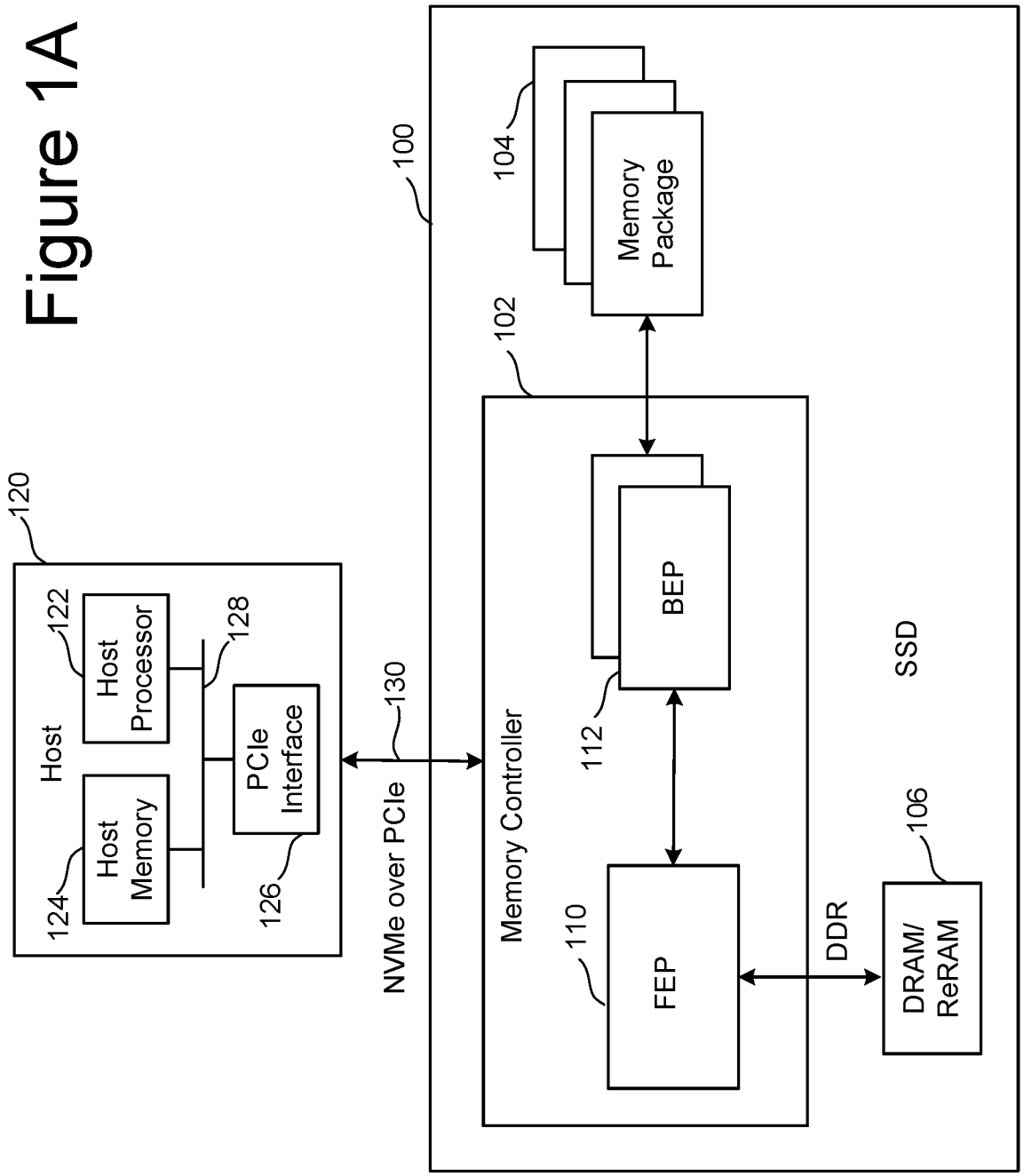
FIG. 1A is a block diagram of one embodiment of a storage system connected to a host.

The present technology will now be described with reference to the figures, which in embodiments, relate to calibration of read reference levels in a non-volatile storage system. The basic unit of storage in non-volatile storage systems is a memory cell. The read reference levels are used to sense a state of the memory cells. In one embodiment, the read reference levels are calibrated by calibrating integration times. An integration time is the length of time for which the charge on a sense node is allowed to change while the memory cell is being sensed. Typically, the sense node is charged to an initial voltage, and then connected to the memory cell to allow a memory cell current to discharge the sense node for the integration time. Changing (e.g., lengthening, shortening) the integration time may be used to, in effect, change the impact of a read reference voltage. For example, changing the integration time may be the equivalent of a slight change to the read reference voltage.

Calibrating the integration time may be much faster than calibrating the reference voltage itself. This is due, in part, to reducing the number of different reference voltages that need to be applied during calibration. For example, one possible technique for calibrating read reference voltages will apply a number of test read reference voltages. Each read reference voltage may need to charge up a conductive element, such as a word line, thereby taking considerable time. Embodiments in which the integration time is calibrated may use different test integration times for a given read reference voltage, thereby reducing the number of read reference voltages. Hence, calibrating the integration time(s) is very efficient timewise. Also, power consumption may be reduced.

In some embodiments, the integration times are calibrated in response to a decoding error. For example, if a codeword is not successfully decoded with an error correcting code (ECC) engine, then the integration times may be calibrated followed by another attempt to decode the codeword. However, the integration times could be calibrated at any time, such as after a certain number of program/erase cycles.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

FIGS. 1A-3C, 4, 5A, 5B, and 6 describe one example of a storage system that can be used to implement the technology disclosed herein.

FIG. 1A is a block diagram of one embodiment of a storage system 100 (which may also be referred to as a memory system) connected to a host 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit110. In some embodiments, an integrated memory assembly is referred to as a memory package. For example, the BEP circuit 112 can carry out the read, erase and programming processes. Additionally, the BEP circuit 112 ca perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory package 104. Each memory package 104 may contain one or more memory dies. In one embodiment, each memory die in the memory package 104 utilize NAND flash memory (including two dimensional NAND flash memory and/or three dimensional NAND flash memory). In other embodiments, the memory package 104 can include other types of memory; for example, the memory package can include Phase Change Memory (PCM) memory.

Memory controller 102 communicates with host 120 using an interface 130 that implements NVM Express (NVMe) over PCI Express (PCIe). For working with storage system 100, host 120 includes a host processor 122, host memory 124, and a PCIe interface 126, which communicate over bus 128. Host memory 124 is the host's physical memory, and can be DRAM, SRAM, non-volatile memory or another type of storage. Host 120 is external to and separate from storage system 100. In one embodiment, storage system 100 is embedded in host 120.

Figure 1B:
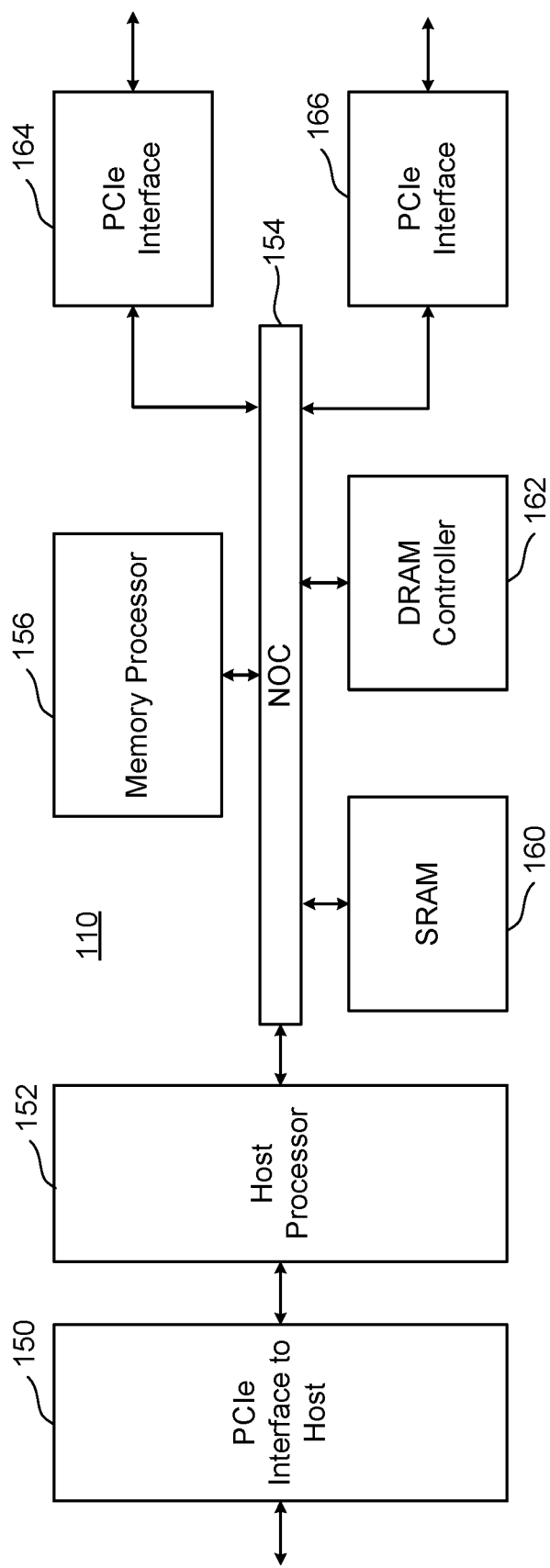
FIG. 1B is a block diagram of one embodiment of a Front End Processor Circuit.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 2A:
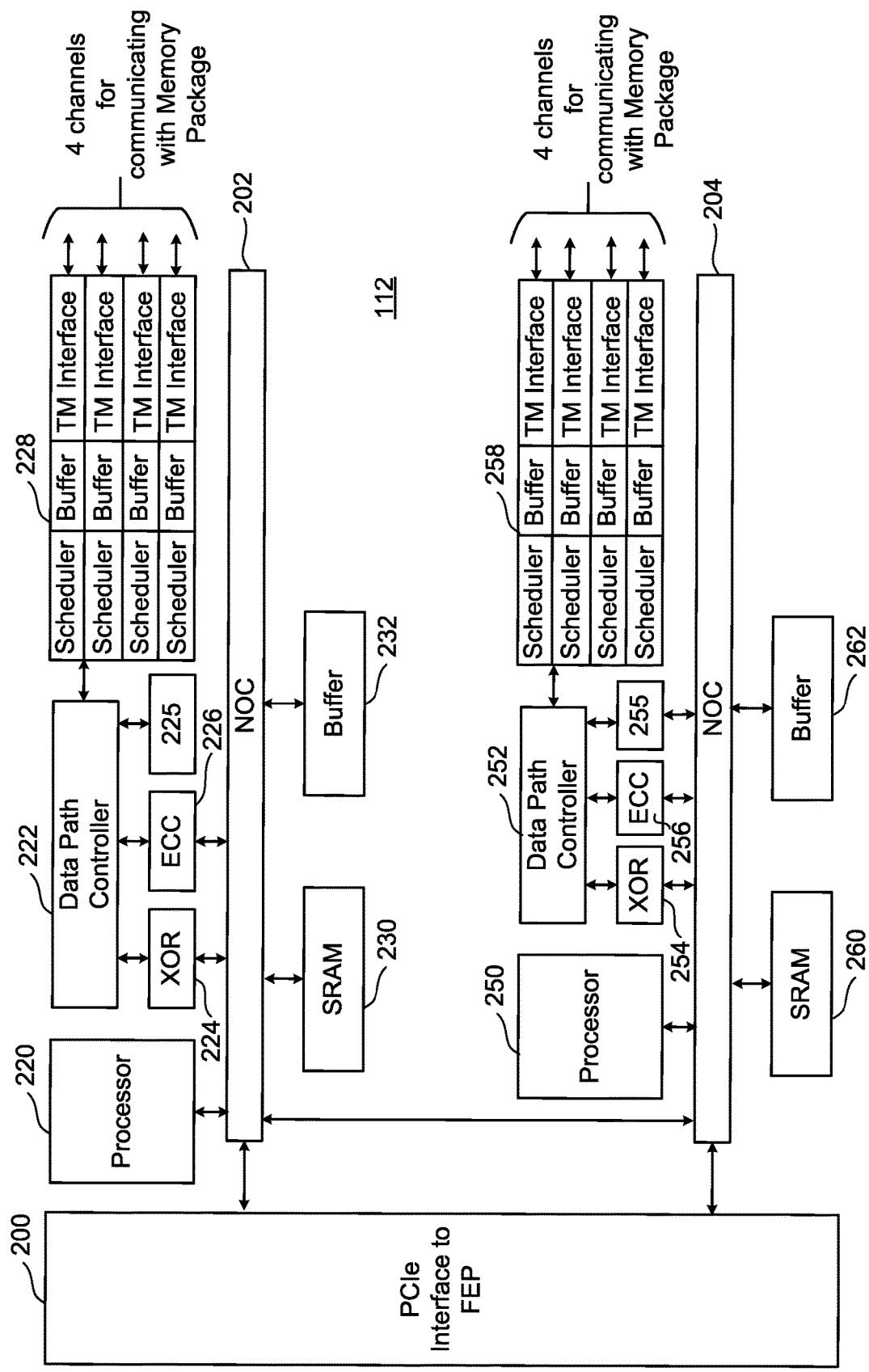
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256), and a read reference calibration engine (225/255). In one embodiment, the read reference calibration engine (225/255) is configured to calibrate integration times for sensing memory cells.

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254, ECC engines 226/256, and read reference voltage calibration engines (225/255) are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
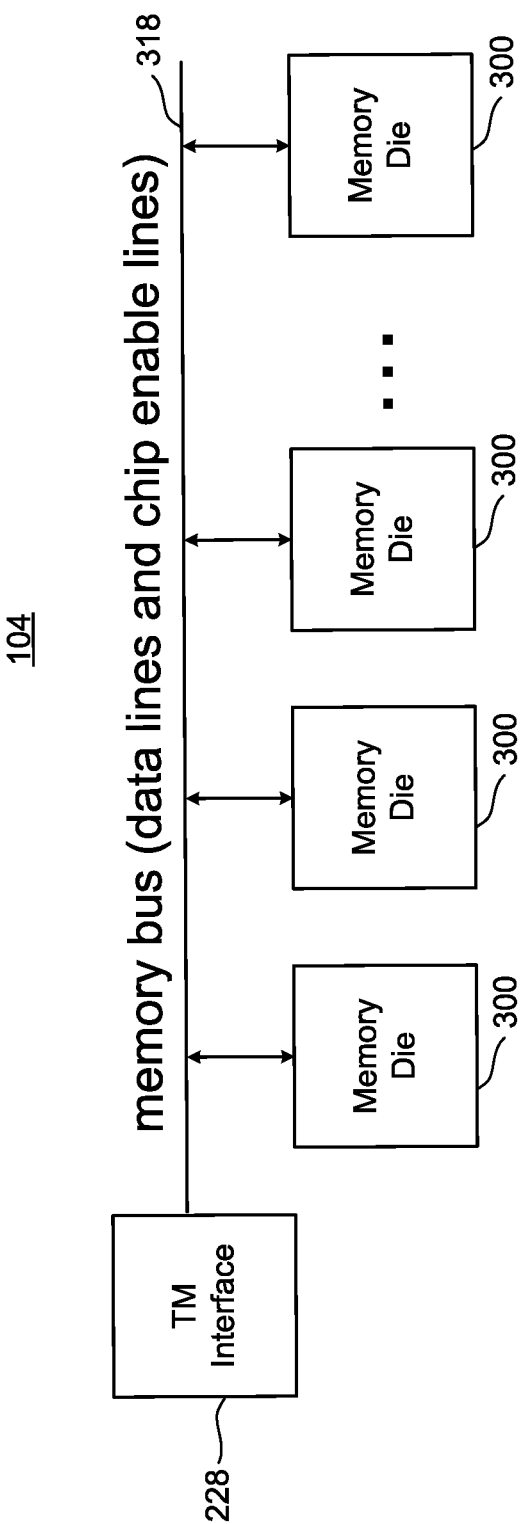
FIG. 2B is a block diagram of one embodiment of a memory package.

FIG. 2B is a block diagram of one embodiment of a memory package 104 that includes a plurality of memory die 300 connected to a memory bus (data lines and chip enable lines) 322. The memory bus 322 connects to a Toggle Mode Interface 228 for communicating with the TM Interface of a BEP circuit 112 (see e.g., FIG. 2A). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 3A:
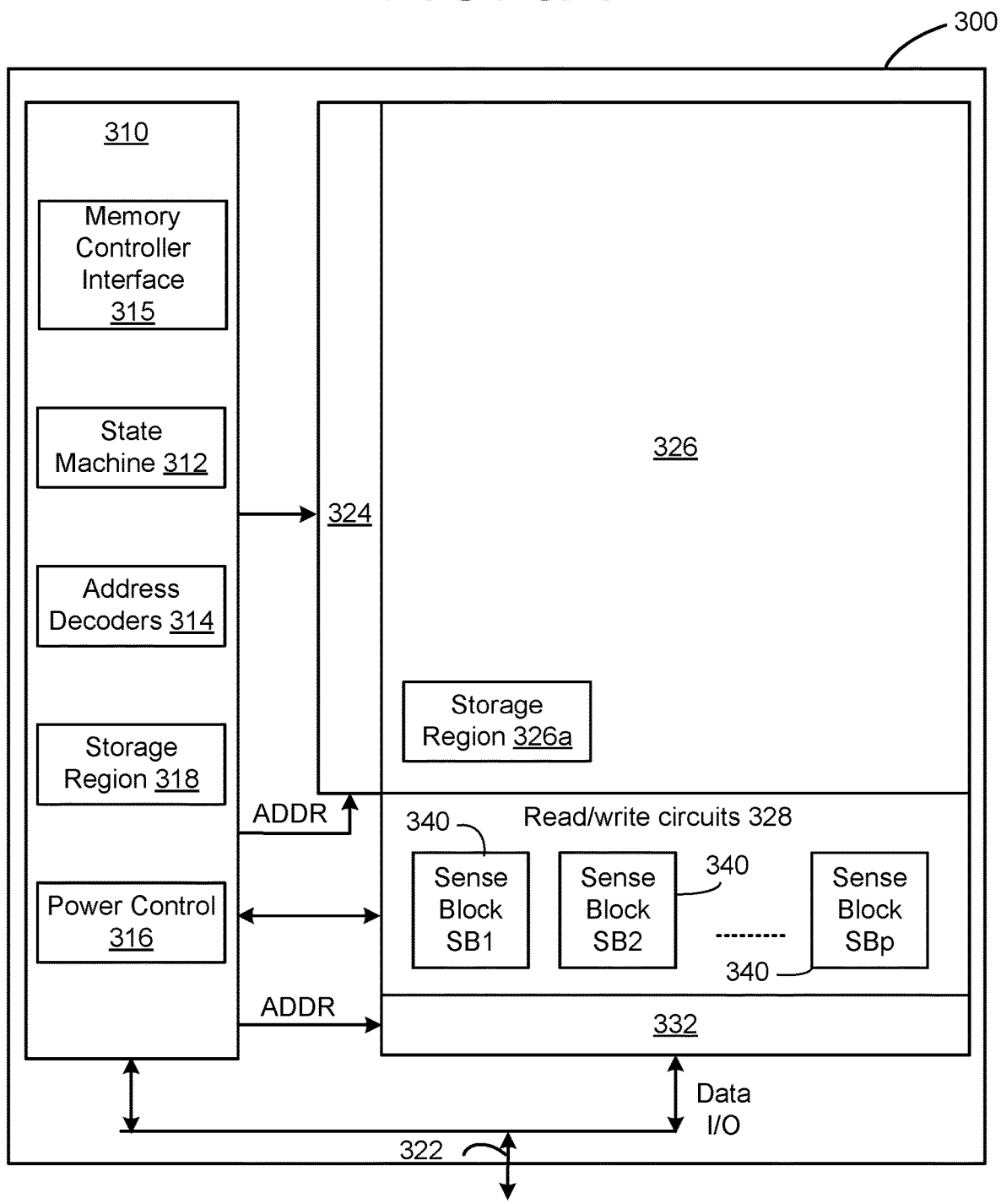
FIG. 3A is a functional block diagram of an embodiment of a memory die.

FIG. 3A is a functional block diagram of one embodiment of a memory die 300. Each of the one or more memory die 300 of FIG. 2B can be implemented as memory die 300 of FIG. 3A. The components depicted in FIG. 3A are electrical circuits. In one embodiment, each memory die 300 includes a memory structure 326, control circuitry 310, read/write circuits 328, and decoders 324/332, all of which are electrical circuits. Memory structure 326 is addressable by word lines via a row decoder 324 and by bit lines via a column decoder 332. The read/write circuits 328 include multiple sense blocks 340 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via memory controller interface 315 (also referred to as a "communication interface"). Memory controller interface 315 is an electrical interface for communicating with memory controller 102. Examples of memory controller interface 315 include a Toggle Mode Interface and an Open NAND Flash Interface (ONFI). Other I/O interfaces can also be used. For example, memory controller interface 315 may implement a Toggle Mode Interface that connects to the Toggle Mode interfaces of memory interface 228/258 for memory controller 102. In one embodiment, memory controller interface 315 includes a set of input and/or output (I/O) pins that connect to communication channel 322 (also refers to herein as a data bus). In one embodiment, communication channel 322 connects to the memory controller 102 as part of the Toggle Mode Interface.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control module 316, a memory controller interface 315, and storage region 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages, integration times, and other parameters. The default values and other parameters could be stored in a region of the memory structure 326 (e.g., structure parameter storage 326*a*). These default values may be updated from time to time. In some embodiments, the values for integration times are calibrated from time to time.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

Storage region 318 may be used to store parameters for operating the memory structure 326. Storage region 318 may include volatile or non-volatile memory. In some embodiments, the parameters include read reference voltages. The parameters may also include integration times for the read reference voltages. The memory structure 326 has storage region 326a, which may also contain a copy of the parameters for operating the memory structure 326. In some embodiments, the parameters are copied from storage region 326a to storage region 318 when the memory die 300 is powered on.

For purposes of this document, control circuitry 310, alone or in combination with read/write circuits 328 and decoders 324/332, comprise one or more control circuits connected to memory structure 326. This one or more control circuits are an electrical circuit that performs the functions described below in the flow charts. In other embodiments, the one or more control circuits can consist only of controller 102 (or other controller), which is an electrical circuit in combination with software (e.g., firmware), that performs the functions described below in the flow charts. In one embodiment, the one or more control circuits is the controller where the controller is an electrical circuit that does not use hardware. In another alternative, the one or more control circuits comprises controller 102 and control circuitry 310 performing the functions described below in the flow charts. In another embodiment, the one or more control circuits comprises state machine 312 (and/or a microcontroller and/or microprocessor) alone or in combination with controller 102. In another alternative, the one or more control circuits comprises controller 102, control circuitry 310, read/write circuits 328 and decoders 324/332 performing the functions described below in the flow charts. In other embodiments, the one or more control circuits comprises one or more electrical circuits that operate the non-volatile memory.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3B:
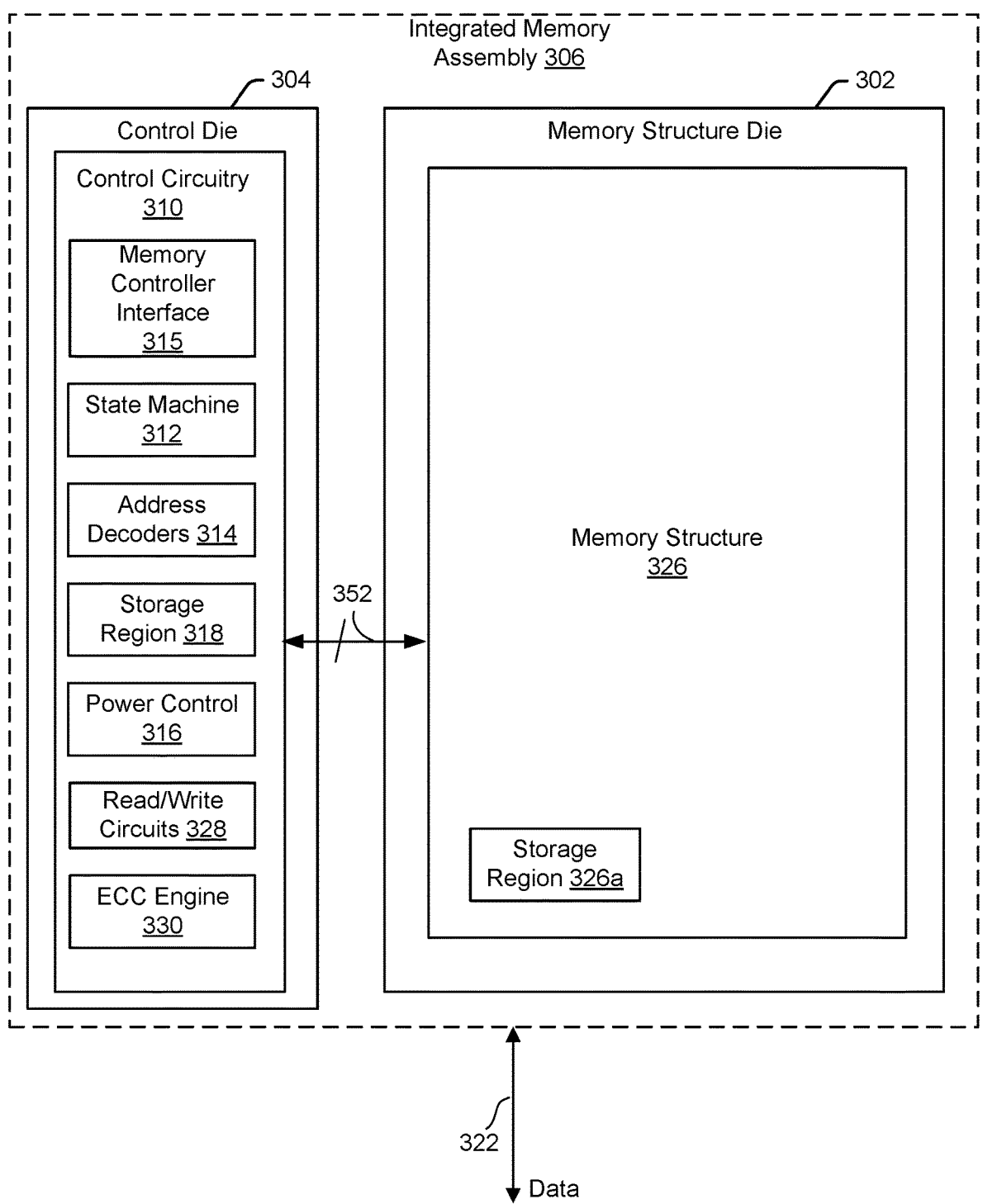
FIG. 3B is a functional block diagram of an embodiment of an integrated memory assembly.

FIG. 3B depicts a functional block diagram of one embodiment of an integrated memory assembly 306. The integrated memory assembly 306 may be used in a memory package 104 in storage system 100. In one embodiment, the integrated memory assembly 306 includes two types of semiconductor die (or more succinctly, "die"). Memory structure die 302 includes include memory structure 326. Memory structure 326 may contain non-volatile memory cells. Control die 304 includes control circuitry 310. In some embodiments, the control die 304 is configured to connect to the memory structure 326 in the memory structure die 302. For example, the control circuitry 310 is configured to be connected to non-volatile memory cells in memory structure 326 in memory structure die 302. In some embodiments, the memory structure die 302 and the control die 304 are bonded together. The control circuitry 310 includes state machine 312, an address decoder 314, a power control circuit 316, memory controller interface 315, storage region 318, and ECC engine 330. Storage region may store parameters such as read reference voltages, as well as integration times for read reference voltages. In some embodiments, the control circuitry 310 is configured to calibrate the integration times, as disclosed herein. The control circuitry 310 also includes read/write circuits 328. In another embodiment, a portion of the read/write circuits 328 are located on control die 304, and a portion of the read/write circuits 328 are located on memory structure die 302. The term apparatus as used herein may include, but is not limited to, memory die 300, control die 304, memory package 104, storage device 100, memory controller 102, or a host system 120 that includes a storage device 100.

The error correction code (ECC) engine 330 is configured to decode are error correct codewords. Herein, ECC engine 330 may be referred to as an on-die ECC engine. In one embodiment, the on-die ECC engine 330 is configured to encode data bits from the memory controller 102 into codewords that contain the data bits and parity bits. The control circuitry stores the codewords in the memory structure 326. In one embodiment, the on-die ECC engine 330 is configured to decode the codewords, which are read back from the memory structure 326. In some embodiments, the on-die ECC engine 330 is configured to calibrate integration times for reading memory cells in the memory structure 326.

Any subset of components in the control circuitry 310 of control die 304 can be considered a control circuit. In another alternative, the control circuit comprises controller 102 and control circuitry 310 of control die 304 performing the functions described below in the flow charts. The control circuit can include hardware only or a combination of hardware and software (including firmware). For example, a controller programmed by firmware is one example of a control circuit. A control circuit can include a processor, PGA (Programmable Gate Array, FPGA (Field Programmable Gate Array), ASIC (Application Specific Integrated Circuit), integrated circuit or other type of circuit.

Pathways 352 are pathways between one or more components in the control circuitry 310 and the memory structure on memory structure die 302. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. A pathway may be used to provide a read reference voltage from the power control module 316 to a selected word line connected to memory cells being read in the memory structure 326.

In one embodiment, integrated memory assembly 306 includes a set of input and/or output (I/O) pins that connect to communication channel 322 (also refers to herein as a data bus). Communication channel 322 is depicted as being connected to integrated memory assembly 306 for generality. Communication channel 322 may connect to either or both of die 302 and/or 304. In one embodiment, communication channel 322 connect the memory controller 102 directly to control die 304.

Figure 3C:
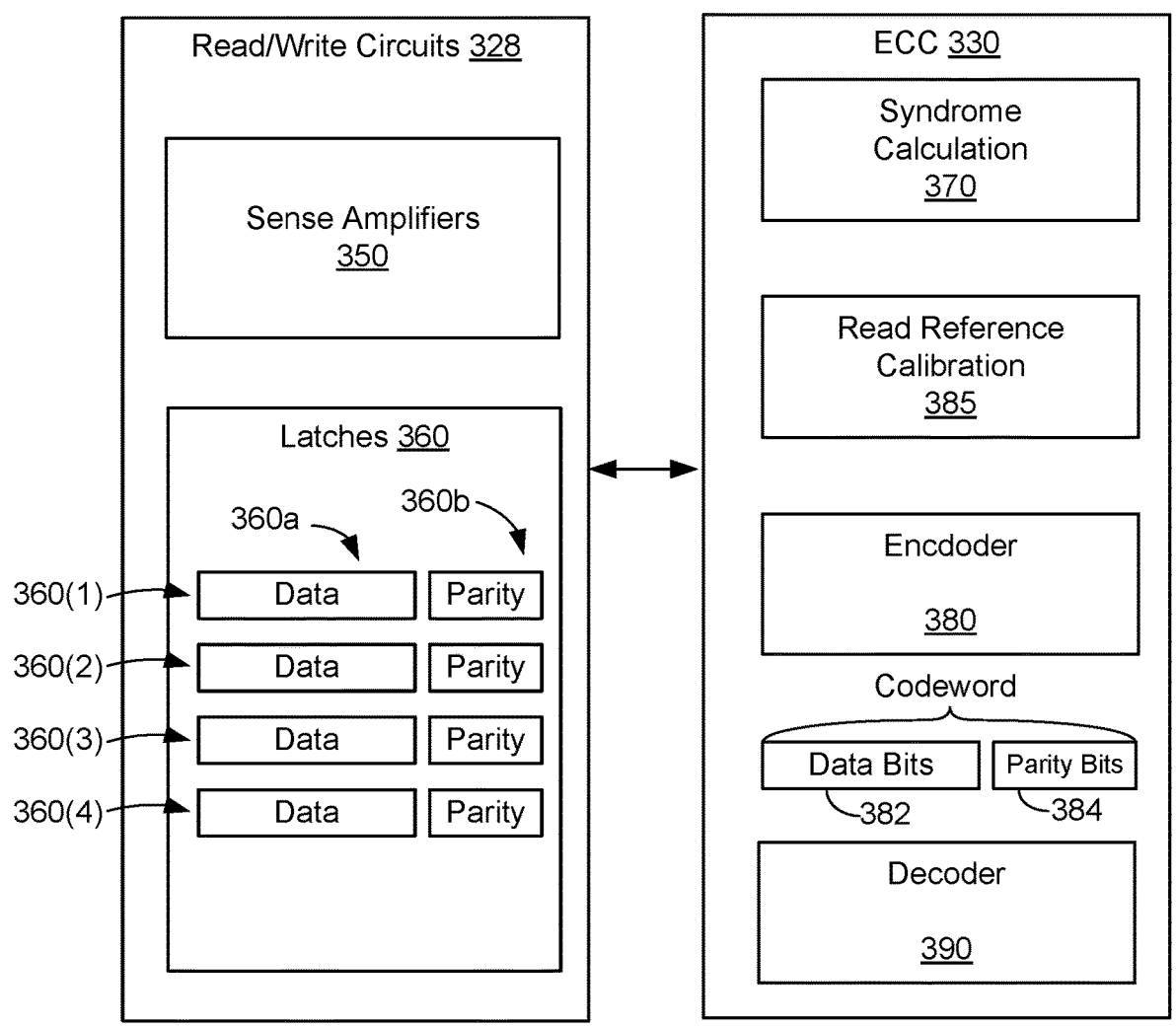
FIG. 3C is a block diagram of one embodiment of a read/write circuits and ECC of an integrated memory assembly.

FIG. 3C is a block diagram of one embodiment of the read/write circuits 328 and ECC engine 330 of the control die 304. The read/write circuits 328 have sense amplifiers 350 and latches 360. The latches 360 may include data latches 360a and parity latches 360b. In one embodiment, the data latches 360a store data bits of the codeword and the parity latches store parity bits of the codeword. It is not required that there be specific latches for data bits and for parity bits. FIG. 3C depicts four sets of data latches 360(1), 360(2), 360(3), 360(4). Each set may be used to store a codeword for a different page. In an embodiment in which four bits are stored per memory cell, four pages are stored in a set of memory cells. The four pages may be referred to as a lower page (LP), lower-middle page (LMP), upper-middle page (UMP), and an upper page (UP). In another embodiment, the sense amplifiers 350 are on the memory structure die 302, but the latches 360 are on the control die 304.

The on-die ECC engine 330 is able to encode data bits received from the memory controller 102. In one embodiment, the on-die ECC engine 330 forms codewords that each contain data bits and parity bits. In one embodiment, the memory controller 102 provides the codewords to the control die 304. The control circuitry 310 stores the codewords into non-volatile memory cells in the memory structure 326. Upon a request from the memory controller 102 to read data, the control circuitry 310 reads codewords from the memory structure 326. The on-die ECC engine 330 is also able to decode and error correct the codewords read from the memory structure 326. In some embodiments, the on-die ECC engine 330 calculates parity bits for each unit of data (e.g., page) that is being stored. The parity bits (also referred to as an error correction code) may be stored with the unit of data (e.g., page). The combination of the unit of data and its associated parity bits are referred to as a codeword. In one embodiment, the parity bits are stored remotely from the unit of data (e.g., page).

The on die ECC engine 330 includes syndrome calculation logic 370, an encoder 380, a decoder 390, and read reference calibration 385. The encoder 380 is configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The encoder 380 may form a codeword, which contains data bits 382 and parity bits 384. The data bits may be provided by the memory controller 102.

In one embodiment, the data bits 382 are stored in the data latches 360a, and the parity bits 384 are stored in the parity latches 360b. Based on the bits in the latches 360, the sense amplifiers 350 may control bit line voltages in the memory structure 326 when the memory cells are being programmed. In this manner, the codewords may be programmed into memory cells in the memory structure 326. It will be appreciated that other voltages may also be applied to the memory structure 326, such applying a program voltage to memory cells that are selected for programming.

The decoder 390 is configured to decode the codewords that were stored in the memory structure die 302. In one embodiment, sense amplifiers 350 sense bit lines in the memory structure 326 in order to read a codeword. The sense amplifiers 350 may store the read codeword into latches 360. The decoder 390 is able to detect and correct errors in the codeword. In one embodiment, the decoder 390 is a relatively low power decoder, as compared to a decoder on the memory controller 102. In one embodiment, the decoder on the memory controller 102 is able to correct more bit errors in the codeword than can typically be corrected by decoder 390. Thus, decoder 390 may provide a power versus error correction capability tradeoff. For example, decoder 390 may be very efficient with respect to power consumption, but at the expense of possibly not being able to correct a high number of errors in a codeword.

In one embodiment, the decoder 390 implements a hard bit decoder. In one embodiment, the decoder 390 implements a soft bit decoder. The decoder 390 may implement both a hard bit decoder and a soft bit decoder. For example, the control die 304 may first attempt to decode a codeword with the hard bit decoder. If that fails, then the control die 304 may attempt to decode using the soft bit decoder.

In some embodiments, the decoder 390 is based on a sparse bipartite graph having bit (or variable) nodes and check nodes. The decoder 390 may pass messages between the bit nodes and the check nodes. Passing a message between a bit node and a check node is accomplished by performing a message passing computation, in some embodiments. The message passing computation may be based on believe propagation.

The syndrome calculation logic 370 is able to determine a syndrome weight for codewords. The syndrome weight refers to the number of parity check equations that are unsatisfied. Parity check equations are discussed in more detail in connection with FIGS. 3D and 3E. The initial syndrome weight of a codeword may correlate with the bit error rate (BER) of that codeword. Thus, the control die 304 may estimate a BER for a codeword based on the initial syndrome weight. In one embodiment, the syndrome calculation logic 370 is implemented in hardware. The syndrome weight can be determined without fully decoding a codeword. Hence, the initial syndrome weight can be calculated in less time and with less power than for decoding a codeword. In some embodiments, the control die 304 makes management decisions based on the initial syndrome weight. For example, the control die 304 may calibrate soft bit reference voltages based on the syndrome weight. In one embodiment, the control die 304 calibrates soft bit reference voltages based on the BER.

The read reference calibration 385 is configured to calibrate integration times for reading memory cells. The read reference calibration 385 may use one or more different techniques to determine the new integration times. By the control die 304 determining the new integration times (in many cases), the memory controller 102 is substantially less burdened with such tasks.

Figures 3D, 3E:
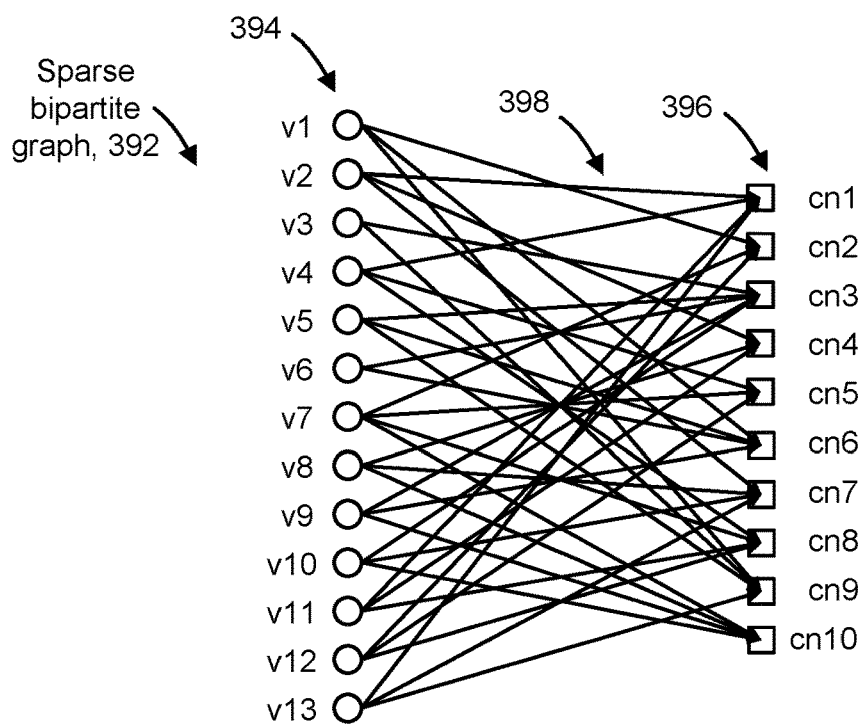
FIG. 3D depicts an example of a sparse parity check matrix H.
FIG. 3E depicts a sparse bipartite graph which corresponds to the sparse parity check matrix of FIG. 3D.

As noted above, in some embodiments, the on-die ECC engine 330 uses a sparse parity check matrix. Note that ECC 226/256 on the controller 102 could also use a sparse parity check matrix. FIG. 3D depicts an example of a sparse parity check matrix H (which may also be represented as a sparse bipartite graph). The matrix includes M rows and K+M columns, which are in correspondence with K information bits and M parity bits in each codeword of length N=K+M. Further, the parity bits are defined such that M parity check equations are satisfied, where each row of the matrix represents a parity check equation.

FIG. 3E depicts a sparse bipartite graph 392 which corresponds to the sparse parity check matrix of FIG. 3D. Specifically, the code can be defined by a sparse bipartite graph G=(V,C,E) with a set V of N bit nodes 394 (N=13 in this example), a set C of M check nodes 396 (M=10 in this example) and a set E (E=38 in this example) of edges 398 connecting bit nodes 394 to check nodes 396. The bit nodes correspond to the codeword bits and the check nodes correspond to parity-check constraints on the bits. A bit node 394 is connected by edges 398 to the check nodes 396 it participates in.

During decoding, one embodiment of the decoder 390 attempts to satisfy the parity checks. In this example, there are ten parity checks, as indicated by the check nodes cn1 through cn10. The first parity check at cn1 determines if $v2 \oplus v4 \oplus v11 \oplus v13=0$, where "$\oplus$" denotes the exclusive-or (XOR) logical operation. This check is satisfied if there is an even number of "1" in bits corresponding to variable nodes v2, v4, v11 and v13. This check is denoted by the fact that arrows from variable nodes v2, v4, v11 and v13 are connected to check node cn1 in the bi-partite graph. The second parity check at cn2 determines if $v1 \oplus v7 \oplus v12=0$, the third parity check at cn3 determines if $v3 \oplus v5 \oplus v6 \oplus v9 \oplus v10=0$, the fourth parity check at cn4 determines if $v2 \oplus v8 \oplus v11=0$, the fifth parity check at cn5 determines if $v4 \oplus v7 \oplus v12=0$, the sixth parity check at cn6 determines if $v1 \oplus v5 \oplus v6 \oplus v9=0$, the seventh parity check at cn7 determines if $v2 \oplus v8 \oplus v10 \oplus v13=0$, the eighth parity check at cn8 determines if $v4 \oplus v7 \oplus v11 \oplus v12=0$, the ninth parity check at cn9 determines if $v1 \oplus v3 \oplus v5 \oplus v13=0$ and the tenth parity check at cn10 determines if $v7 \oplus v8 \oplus v9 \oplus v10=0$.

In one embodiment, the decoder 390 uses an iterative probabilistic decoding process involving iterative message passing decoding algorithms. These algorithms operate by exchanging messages between bit nodes and check nodes over the edges of the underlying bipartite graph representing the code.

The decoder 390 may be provided with initial estimates of the codeword bits (based on the content that is read from the memory structure 326). These initial estimates may be refined and improved by imposing the parity-check constraints that the bits should satisfy as a valid codeword. This may be done by exchanging information between the bit nodes representing the codeword bits and the check nodes representing parity-check constraints on the codeword bits, using the messages that are passed along the graph edges.

Figure 4:
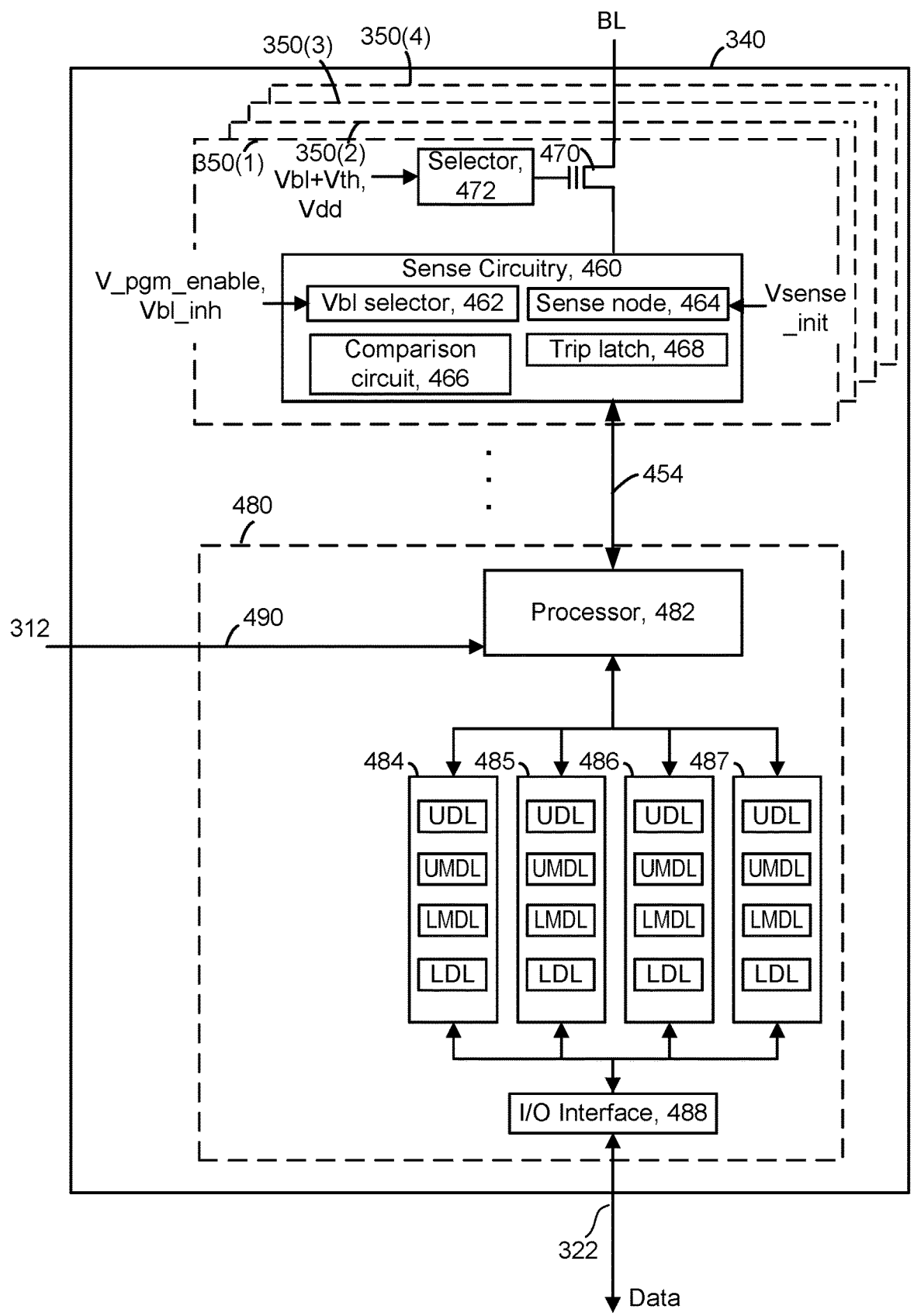
FIG. 4 is a block diagram depicting one embodiment of a sense block.

FIG. 4 is a block diagram depicting one embodiment of a sense block 340. The sense block is part of the read/write circuits 328. An individual sense block 340 is partitioned into one or more core portions, referred to as sense circuits or sense amplifiers 350(1)-350(4), and a common portion, referred to as a managing circuit 480. In one embodiment, there will be a separate sense circuit for each bit line/NAND string and one common managing circuit 480 for a set of multiple, e.g., four or eight, sense circuits. Each of the sense circuits in a group communicates with the associated managing circuit via data bus 454. Thus, there are one or more managing circuits which communicate with the sense circuits of a set of storage elements (memory cells).

The sense amplifier 350(1), as an example, comprises sense circuitry 460 that performs sensing by determining whether a conduction current in a connected bit line is above or below a predetermined threshold level. The sensing can occur in a read or verify operation. The sense circuit also supplies a bit line voltage during the application of a program voltage in a program operation. Note that other circuitry (e.g., power control 316 under control of state machine 312) may control the application of voltages to the word lines during read or program. Thus, state machine 312 may control power control 316 to control the timing of read reference voltages (as well as other voltages) to the word lines.

The sense circuitry 460 may include a Vbl selector 462, a sense node 464, a comparison circuit 466 and a trip latch 468. During the application of a program voltage, the Vbl selector 462 can pass a program enable voltage (e.g., V_pgm_enable) or a program-inhibit voltage (e.g., Vbl_inh) to a bit line connected to a memory cell. Program inhibit voltages are applied to bit lines coupled to memory cells that are not to be programmed and/or bit lines having memory cells that have reached their respective target threshold voltage through execution of a programming process. These may be referred to as "unselected bit lines." When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 470 (e.g., an nMOS) can be configured as a pass gate to pass Vbl from the Vbl selector 462, by setting the control gate voltage of the transistor sufficiently high, e.g., higher than the Vbl passed from the Vbl selector. For example, a selector 472 may pass a power supply voltage Vdd, e.g., 3-4 V to the control gate of the transistor 470.

The sense amplifier 350(1) is configured to control the timing of when the voltages are applied to the bit line. During sensing operations such as read and verify operations, the bit line voltage is set by the transistor 470 based on the voltage passed by the selector 472. The bit line voltage is roughly equal to the control gate voltage of the transistor minus its Vt (e.g., 3 V). For example, if Vbl+Vt is passed by the selector 472, the bit line voltage will be Vbl. This assumes the source line is at 0 V. The transistor 470 clamps the bit line voltage according to the control gate voltage and acts as a source-follower rather than a pass gate. The Vbl selector 462 may pass a relatively high voltage such as Vdd which is higher than the control gate voltage on the transistor 470 to provide the source-follower mode. During sensing, the transistor 470 thus charges up the bit line.

In one approach, the selector 472 of each sense amplifier can be controlled separately from the selectors of other sense amplifiers, to pass Vbl or Vdd. The Vbl selector 462 of each sense amplifier can also be controlled separately from the Vbl selectors of other sense amplifiers.

During sensing, the sense node 464 is charged up to an initial voltage such as Vsense_init=3 V. The sense node is then connected to the bit line via the transistor 470, and an amount of decay of the sense node is used to determine whether a memory cell is in a conductive or non-conductive state. In one embodiment, a current that flows in the bit line discharges the sense node (e.g., sense capacitor). The length of time that the sense node is allowed to decay may be referred to herein as an "integration time." The comparison circuit 466 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 350(1) includes a trip latch 468 that is set by the comparison circuit 466 based on whether the memory cell is in a conductive or non-conductive state. The data in the trip latch can be a bit which is read out by the processor 482.

When the memory cell is connected to the sense node, the current at the sense node may be substantially the same as the memory cell current. Equation 1 describes capacitive current in differential form. Equation 2 describes capacitive current in integral form.

$$i = C \frac{dv}{dt} \quad \text{Eq. 1}$$

$$v = v_0 - \frac{1}{C} \int_0^T i \, dt \quad \text{Eq. 2}$$

The capacitance (C) in Equations 1 and 2 is the capacitance of the sense node 464. The integration time [0, T] is represented in Equation 2. Thus, the integration time is the time for which the memory cell current discharges the sense node. The initial voltage at the sense node is $v_0$ in Equation 2. Since the current that flows from the sense node is substantially the same as the memory cell current, then i in Equation 1 or 2 is substantially the same as the memory cell current. Stated another way, the memory cell current discharges the sense node for the integration time [0, T]. Although the memory cell current discharges the sense node voltage in this example, the memory cell current could be used to charge the sense node.

Changing (e.g., lengthening, shortening) the integration time may be used to use to, in effect, change the impact of a read reference voltage. For example, changing the integration time may be the equivalent of a slight change to the read reference voltage. Note that if the read reference voltage is changed by a small amount (with integration time the same), then the memory cell current may change by a small amount. Hence, Equation 2 indicates that the final voltage (v) will be impacted. However, by changing the integration time (with the reference voltage the same), then the sense node will be discharged for a different amount of time by the memory cell current, which will also impact the final voltage (v). Recall that the comparison circuit 466 may compare the final voltage (v) to a trip voltage Vtrip to test the condition of the memory cell.

In some techniques, the magnitude of the read reference voltage is changed from time to time to improve the quality of the codeword read from the memory cells. In other words, the magnitude of the read reference voltages are calibrated from time to time. In some embodiments, the integration time is changed (or calibrated) in order to improve the quality of the codeword read from the memory cells. Note that it is also possible to calibrate both the magnitude of the read reference voltages, as well as to calibrate the integration times for the read reference voltages. Hence, calibrating the integration times does not preclude also calibrating the magnitude of the read reference voltages.

The managing circuit 480 comprises a processor 482, four example sets of data latches 484, 485, 486, 487 and an I/O Interface 488 coupled between the sets of data latches and data bus 322 (data bus may connect to the memory controller 102). One set of data latches, e.g., comprising individual latches LDL, LMDL, UMDL, and UDL, can be provided for each sense amplifier. In some cases, fewer or additional data latches may be used. LDL stores a bit for a lower page of data, LMDL stores a bit for a lower-middle page of data, UMDL stores a bit for an upper-middle page of data, and UDL stores a bit for an upper page of data. This is in a sixteen level or four bits per memory cell memory device. In one embodiment, there are eight levels or three bits per memory cell.

The processor 482 performs computations, such as to determine the data stored in the sensed memory cell and store the determined data in the set of data latches. Each set of data latches 484-487 is used to store data bits determined by processor 482 during a read operation, and to store data bits imported from the data bus 322 during a program operation which represent write data meant to be programmed into the memory. I/O interface 488 provides an interface between data latches 484-487 and the data bus 322.

The processor 482 may also be used to determine what voltage to apply to the bit line, based on the state of the latches.

During reading, the operation of the system is under the control of state machine 312 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 482 via the data bus 454. At that point, processor 482 determines the resultant memory state by consideration of the tripping event(s) of the sense circuit and the information about the applied control gate voltage from the state machine via input lines 490. It then computes a binary encoding for the memory state and stores the resultant data bits into data latches 484-487.

Some implementations can include multiple processors 482. In one embodiment, each processor 482 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense amplifiers, the state machine needs to read the wired-OR line four times, or logic is added to processor 482 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 484-487 from the data bus 322, in the LDL, LMDL, UMDL, and UDL latches, in a four-bit per memory cell implementation.

The program operation, under the control of the state machine, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 482 monitors the read back memory state relative to the desired memory state. When the two are in agreement, the processor 482 sets the bit line in a program inhibit mode such as by updating its latches. This inhibits the memory cell coupled to the bit line from further programming even if additional program pulses are applied to its control gate.

Each set of data latches 484-487 may be implemented as a stack of data latches for each sense amplifier. In one embodiment, there are three data latches per sense amplifier 350. In some implementations, the data latches are implemented as a shift register so that the parallel data stored therein is converted to serial data for data bus 322, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An LMDL, UMDL or UDL latch is flipped when a lower-middle, upper-middle or upper page bit, respectively, is stored in an associated memory cell. This occurs when an associated memory cell completes programming.

Figure 5A:
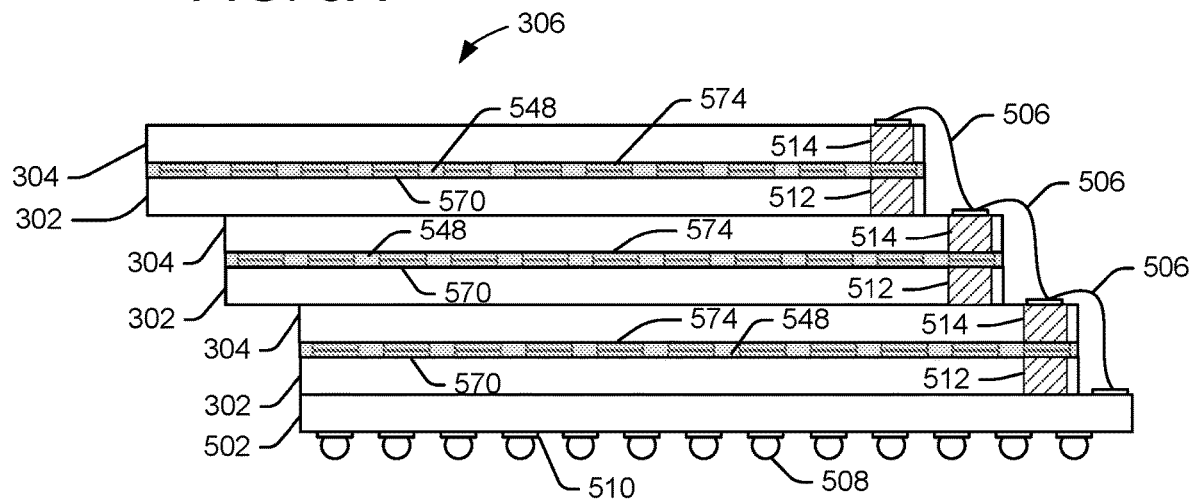
FIG. 5A depicts a side view of an embodiment of an integrated memory assembly stacked on a substrate.

In some embodiments, there is more than one control die 304 and more than one memory structure die 302 in an integrated memory assembly 306. In some embodiments, the integrated memory assembly 306 includes a stack of multiple control die 304 and multiple memory structure die 302. FIG. 5A depicts a side view of an embodiment of an integrated memory assembly 306 stacked on a substrate 502 (e.g., a stack comprising control dies 304 and memory structure dies 302). The integrated memory assembly 306 has three control dies 304 and three memory structure dies 302. In some embodiments, there are more than three memory structure dies 302 and more than three control die 304.

Each control die 304 is affixed (e.g., bonded) to at least one of the memory structure dies 302. Some of the bond pads 570, 574, are depicted. There may be many more bond pads. A space between two dies 302, 304 that are bonded together is filled with a solid layer 548, which may be formed from epoxy or other resin or polymer. This solid layer 548 protects the electrical connections between the dies 302, 304, and further secures the dies together. Various materials may be used as solid layer 548, but in embodiments, it may be Hysol epoxy resin from Henkel Corp., having offices in California, USA.

The integrated memory assembly 306 may for example be stacked with a stepped offset, leaving the bond pads at each level uncovered and accessible from above. Wire bonds 506 connected to the bond pads connect the control die 304 to the substrate 502. A number of such wire bonds may be formed across the width of each control die 304 (i.e., into the page of FIG. 5A).

A memory structure die through silicon via (TSV) 512 may be used to route signals through a memory structure die 302. A control die through silicon via (TSV) 514 may be used to route signals through a control die 304. The TSVs 512, 514 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 508 may optionally be affixed to contact pads 510 on a lower surface of substrate 502. The solder balls 508 may be used to electrically and mechanically couple the integrated memory assembly 306 to a host device such as a printed circuit board. Solder balls 508 may be omitted where the integrated memory assembly 306 is to be used as an LGA package. The solder balls 508 may form a part of the interface between the integrated memory assembly 306 and the memory controller 102.

Figure 5B:
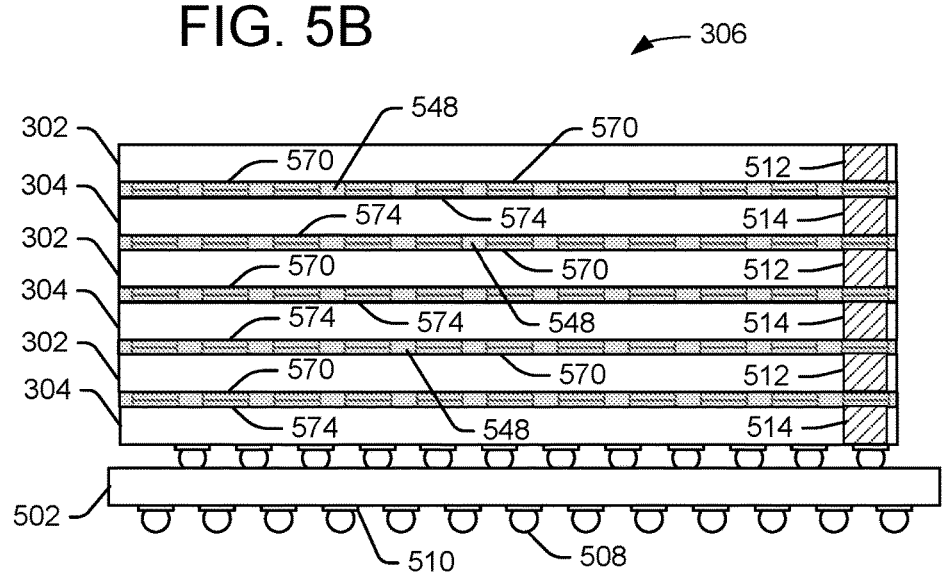
FIG. 5B depicts a side view of an embodiment of an integrated memory assembly stacked on a substrate.

FIG. 5B depicts a side view of an embodiment of an integrated memory assembly 306 stacked on a substrate 502. The integrated memory assembly 306 has three control die 304 and three memory structure die 302. In some embodiments, there are many more than three memory structure die 302 and many more than three control die 304. In this example, each control die 304 is bonded to at least one memory structure die 302. Optionally, a control die 304 may be bonded to two memory structure die 302.

Some of the bond pads 570, 574 are depicted. There may be many more bond pads. A space between two dies 302, 304 that are bonded together is filled with a solid layer 548, which may be formed from epoxy or other resin or polymer. In contrast to the example in FIG. 5A, the integrated memory assembly 306 in FIG. 5B does not have a stepped offset. A memory structure die through silicon via (TSV) 512 may be used to route signals through a memory structure die 302. A control die through silicon via (TSV) 514 may be used to route signals through a control die 304.

Solder balls 508 may optionally be affixed to contact pads 510 on a lower surface of substrate 502. The solder balls 508 may be used to electrically and mechanically couple the integrated memory assembly 306 to a host device such as a printed circuit board. Solder balls 508 may be omitted where the integrated memory assembly 306 is to be used as an LGA package.

As has been briefly discussed above, the control die 304 and the memory structure die 302 may be bonded together. Bond pads on each die 302, 304 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 302, 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 6:
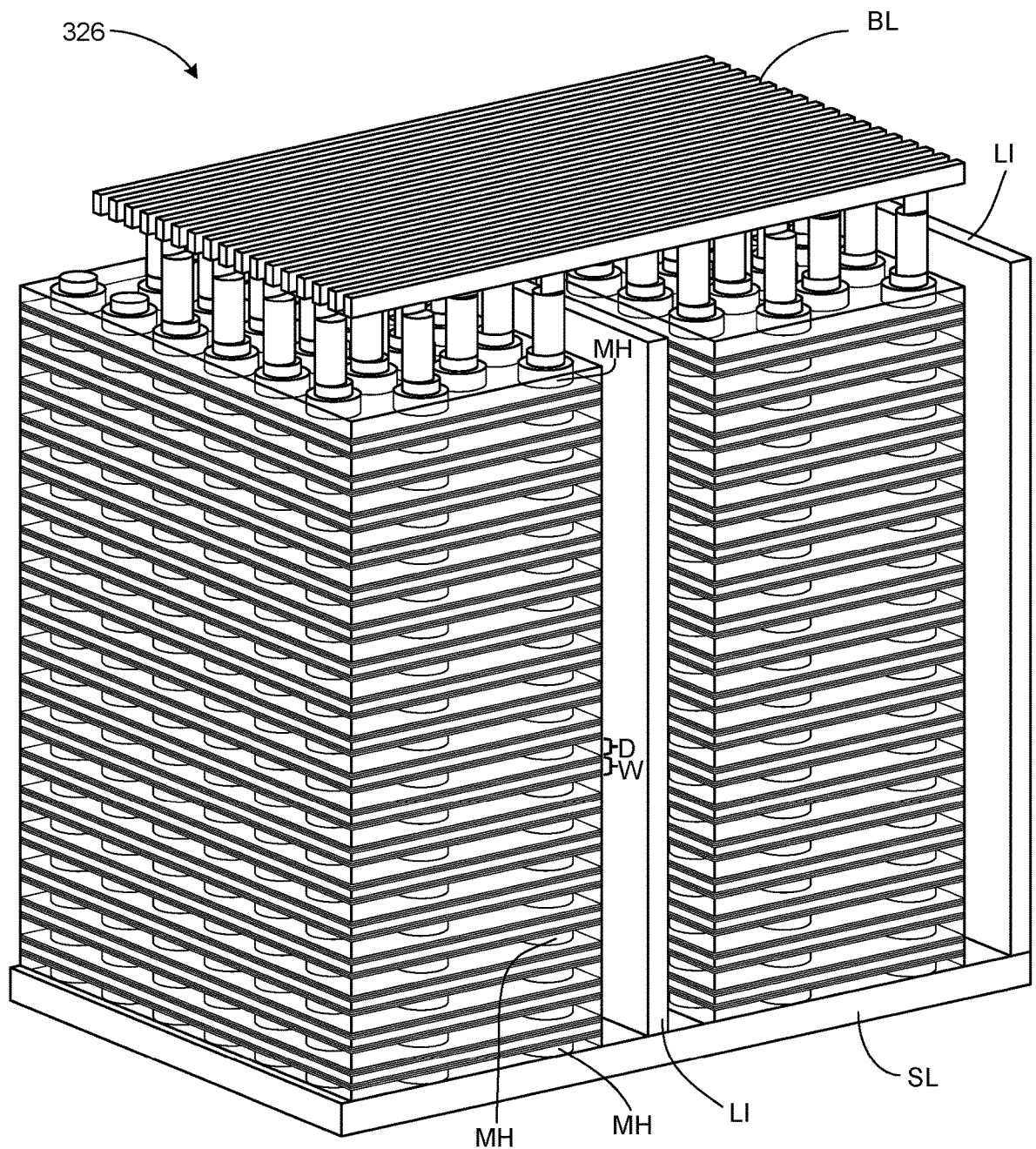
FIG. 6 is a perspective view of a portion of one example embodiment of a monolithic three dimensional memory array that can comprise memory structure.

FIG. 6 is a perspective view of a portion of one example embodiment of a monolithic three dimensional memory array that can comprise memory structure 326, which includes a plurality non-volatile memory cells. For example, FIG. 6 shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 6 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 6, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 7:
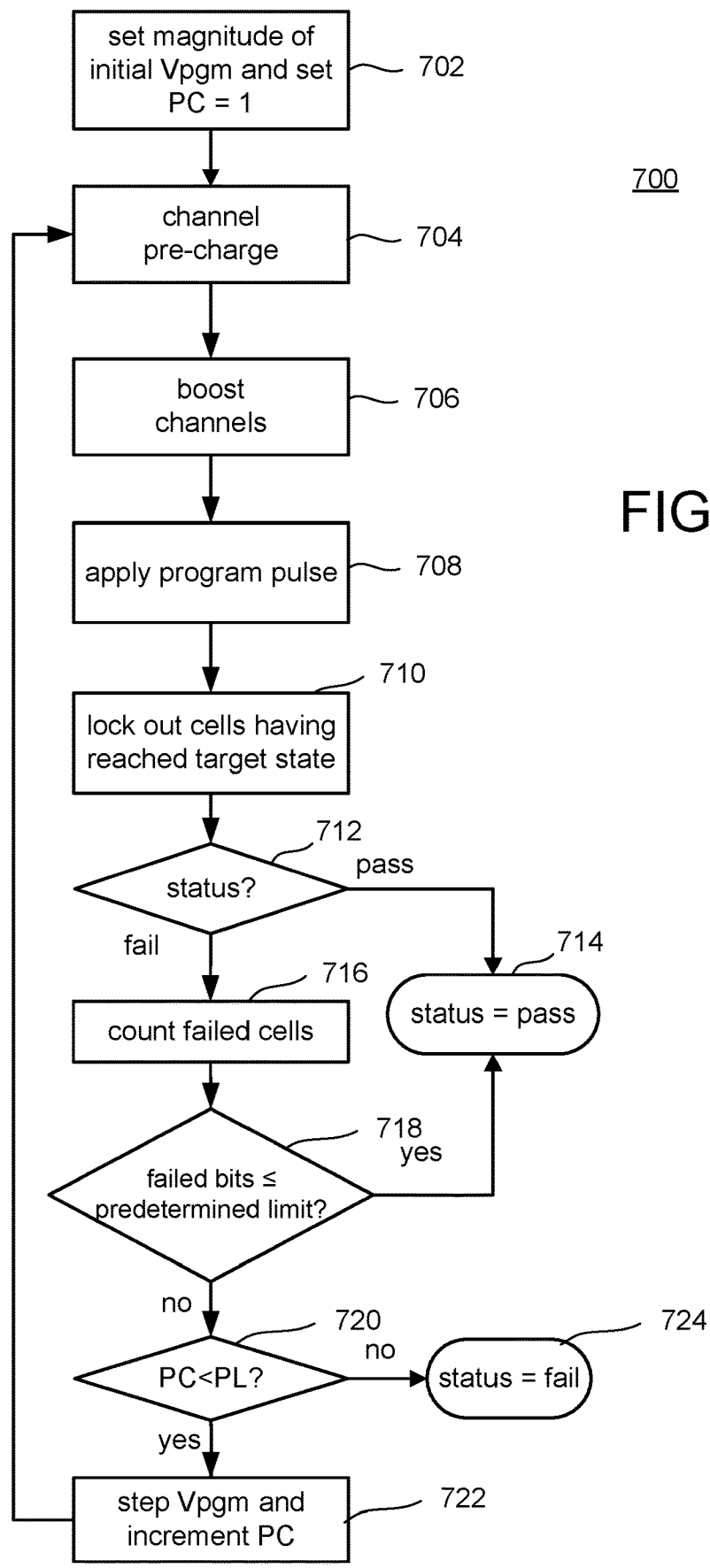
FIG. 7 is a flowchart describing one embodiment of a process for programming NAND strings of memory cells organized into an array.

FIG. 7 is a flowchart describing one embodiment of a process 700 for programming NAND strings of memory cells organized into an array. The process of FIG. 7 can be performed at the direction of state machine 312. In one example embodiment, the process of FIG. 7 is performed on memory die 300 using the control circuitry 310 (and read/write circuits 328, as well as decoders 332/324) discussed above. In one example embodiment, the process of FIG. 7 is performed by integrated memory assembly 306 using the control circuitry 310 discussed above. The process includes multiple loops, each of which includes a program phase (e.g., steps 704-708) and a verify phase (e.g., steps 710-718).

In many implementations, the magnitude of the program pulses is increased with each successive pulse by a predetermined step size. In step 702 of FIG. 7, the programming voltage (Vpgm) is initialized to the starting magnitude (e.g., ~12-16V or another suitable level) and a program counter PC maintained by state machine 312 is initialized at 1.

In one embodiment, the set of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 704 the storage system will pre-charge channels of NAND strings that include memory cells connected to the selected word line that are to be inhibited from programming.

In one embodiment, step 704 is the start of a program operation. In some embodiments, different sets of memory cells are programmed concurrently. For example, programming of memory cells in different memory structures 326 may be performed concurrently. In some embodiments, the start of concurrent program operations (e.g., step 704) is staggered such that step 704 occurs at different times for the different memory structures 326.

In step 706, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 708, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 708, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 710, memory cells that have reached their target states are locked out from further programming. Step 710 may include performing verifying at one or more verify reference levels. In one embodiment, the verification process is performed by testing whether the threshold voltages of the memory cells selected for programming have reached the appropriate verify reference voltage.

In step 710, a memory cell may be locked out after the memory cell has been verified (by a test of the Vt) that the memory cell has reached its target state.

If, in step 712, it is determined that all of the memory cells have reached their target threshold voltages (pass), the programming process is complete and successful because all selected memory cells were programmed and verified to their target states. A status of "PASS" is reported in step 714. Otherwise if, in step 712, it is determined that not all of the memory cells have reached their target threshold voltages (fail), then the programming process continues to step 716.

In step 716, the storage system counts the number of memory cells that have not yet reached their respective target threshold voltage distribution. That is, the system counts the number of memory cells that have, so far, failed to reach their target state. This counting can be done by the state machine 312, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 718, it is determined whether the count from step 716 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 714. In this situation, enough memory cells programmed correctly such that the few remaining memory cells that have not been completely programmed can be corrected using ECC during the read process. In some embodiments, the predetermined limit used in step 718 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 720 and the program counter PC is checked against the program limit value (PL). Examples of program limit values include 1, 12, 16, 19 and 30; however, other values can be used. If the program counter PC is not less than the program limit value PL, then the program process is considered to have failed and a status of FAIL is reported in step 724. If the program counter PC is less than the program limit value PL, then the process continues at step 722 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 722, the process loops back to step 704 and another program pulse is applied to the selected word line so that another iteration (steps 704-722) of the programming process of FIG. 7 is performed.

At the end of a successful programming process, the threshold voltages of the memory cells should be within one or more distributions of threshold voltages for programmed memory cells or within a distribution of threshold voltages for erased memory cells, as appropriate. FIG. 8A illustrates example threshold voltage distributions for the memory array when each memory cell stores four bits of data. Other embodiments, however, may use other data capacities per memory cell (e.g., such as one, two, three, or five bits of data per memory cell). FIG. 8A shows 15 read reference voltages, Vr1-Vr15 for reading data from memory cells. The set of memory cells may be connected to the same word line. Each read reference level is used to distinguish between two adjacent threshold voltage distributions. Stated another way, each read reference level is used to distinguish between two adjacent data states. For example, read reference level Vr4 is used to distinguish between data states S3 and S4. By testing (e.g., performing sense operations) whether the threshold voltage of a given memory cell is above or below the 15 read reference voltages, the system can determine what data state (i.e., S0, S1, S2, S3 . . . ) a memory cell is in. However, as noted above, the integration time has an impact on the effect of the read reference voltage.

FIG. 8A depicts that there may be some overlap between the data states S0-S15. The overlap may occur due to factors such as memory cells losing charge (and hence dropping in threshold voltage). FIG. 8A depicts an example in which four bits are stored per memory cell. Thus, four pages may be stored in a set of memory cells. The set of memory cells may be connected to the same word line. These pages may be referred to as a lower page, lower-middle page, upper-middle page, and upper page. In one embodiment, in order to read the lower page, the memory cells are sensed using four different read reference voltages. For example, the memory cells may be sensed at Vr1, Vr4, Vr6, and Vr11.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Adjusting the reference levels may be used to compensate for the change in the locations of the Vt distributions. One technique for adjusting the reference levels is to change the magnitude of the read reference voltages. FIG. 8A shows examples of this such as Vr1−2Δv, Vr1−Δv, Vr1+Δv, and Vr1+2Δv near the Vr1 reference voltage. In some techniques, the memory cells are sensed at this set of read reference voltages, with an analysis of the sensing results being used to select a new magnitude for the reference voltage. One technique for calibrating read reference voltages is to look for a valley, such as the valley between S3 and S4. In FIG. 8B, the valley is depicted at Vr4, but if the valley is not at, for example, Vr4−Δv, then Vr4−Δv could be selected as the new magnitude for Vr4. Another technique for calibrating read reference voltages is to form codewords based on data read using the various levels (e.g., Vr1−2Δv, Vr1−Δv, etc.) and analyze any error metric such as bit error rate (BER) or syndrome weight (SW).

FIG. 8B depicts the same Vt distributions depicted in FIG. 8A. Five integration times are depicted for each of Vr1, Vr4, Vr6, and Vr11. These five integration times may be used to produce similar results as sensing at five different reference voltage magnitudes. For example, sensing at Vr1 using integration times t−2Δt, t−Δt, t, t+Δt, and t+2Δt may produce similar results as sensing at Vr1−2Δv, Vr1−Δv, Vr1, Vr1+Δv, and Vr1+2Δv.

In embodiments disclosed herein, integration times are calibrated, which serves to adjust the reference levels. In some techniques, the memory cells are sensed at this set of integration times, with an analysis of the sensing results being used to select a new integration time for the associated reference voltage. One technique for calibrating integration times is to look for a valley, such as the valley between S3 and S4. For example, a suitable integration time may be found such that Vr4 is at the valley when using the calibrated integration time. Another technique for calibrating integration times is to form codewords based on data read using the various integration times (e.g., t−2Δt, t−Δt, t, t+Δt, and t+2Δt) and analyze any error metric such as bit error rate (BER) or syndrome weight (SW) of the codewords.

Note that although some embodiments disclosed herein are directed to memory cells in which the state is represented by a threshold voltage (Vt) of the memory cell, the state of the memory cell may be represented by another physical parameter including, but not limited to, resistance or conductance. For example, in FIGS. 8A and 8B the data states are represented by Vt distributions. However, for other types of memory cells the data states may be represented by resistance distributions or conductance distributions.

Figure 9:
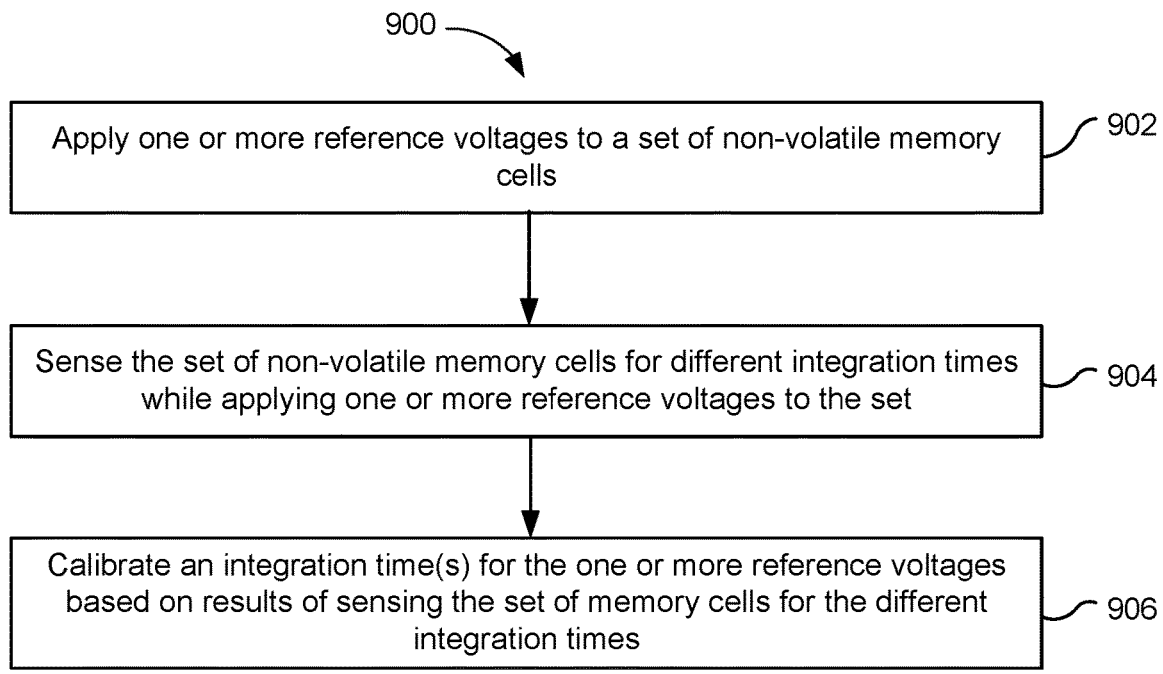
FIG. 9 depicts one embodiment of a flowchart of a process of calibrating one or more integration times.

FIG. 9 depicts one embodiment of a flowchart of a process 900 of calibrating one or more integration times. The integration time is a parameter that is used when sensing the memory cells. In one embodiment, the process 900 could be performed in response to a number of triggers such as, but not limited to, a UECC error, a BER being above a threshold, decoding time being above threshold, etc. A UECC error means that a decoder was unable to successfully decode a codeword. This could apply to a decoder on the control die 304 or a decoder in the memory controller 102.

After calibrating the integration time, a further attempt may be made to decode the data in the memory cells. However, the process 900 could be performed at any time. In some embodiments, the integration time is calibrated from time to time. For example, the integration time could be calibrated after a pre-determined number of program/erase cycles.

Step 902 includes applying one or more reference voltages to a set of non-volatile memory cells. In one embodiment, each of the one or more reference voltages is used to distinguish between two data states. For example, with reference to FIG. 8B, the one or more reference voltages could be any of Vr1-Vr15. In one embodiment, the state machine 312 direct power control 316 to apply the one or more reference voltages to the memory cells. In one embodiment, the one or more reference voltages are applied to a word line that is connected to the memory cells.

Step 904 includes sensing the set of memory cells for different integration times while applying the one or more reference voltages to the set of memory cells. For example, when applying Vr1, the memory cells are sensed using integration times t−2Δt, t−Δt, t, t+Δt, and t+2Δt. The time difference between the integration times could be uniform, but that is not required. Thus, it is not required that there be the same Δt between the integration times. The memory cells could also be sensed for those integration times while applying Vr4, Vr6, and Vr11. This is for an example that is for the lower page. Process 900 could then be repeated for other pages. It is not required; however, to perform process 900 for all of the reference levels associated with a given page.

Step 906 includes calibrating an integration time (or times) for the one or more reference voltages. A separate integration time could be determined for each reference voltage in which case the integration time for each reference voltage could be, but is not required to be, different. However, in one embodiment, the same integration time is used for multiple reference voltages. In one embodiment, the calibrated integration times are only used for sensing this set of memory cells in, for example, an error recovery process. The calibrated integration times could be stored and used again for this set of memory cells or another set of memory cells.

The integration time for a given reference voltage is calibrated based on results of sensing the set of memory cells for the different integration times. There are a number of techniques that can be used to calibrate the integration times. In one embodiment, a bit error rate estimation scan (BES) is used to calibrate the integration times. Briefly, the BES may include sensing memory cells using a set of integration times for each of one or more reference voltages, and then determine an error metric for codewords derived from the sensing. The error metric may be, for example, a syndrome weight or a bit error rate (BER). Further details of one embodiment of calibrating integration times based on a BES scan are described in FIG. 12. In some embodiments, integration times are calibrated by performing a scan for a valley between two Vt distributions. Further details of one embodiment of calibrating integration times based on a valley search are described in FIG. 13.

In some embodiments, the calibrated integration times are used in error recovery of a codeword. Further details of using the calibrated integration times to recover a codeword are described in connection with FIG. 14. In some embodiments, the calibrated integration times are used in the future to read data from this set of memory cells, or another set of memory cells. Thus, in one embodiment, the one or more reference voltages are again applied to the set of non-volatile memory cells after calibrating the integration times. Then, the set of the memory cells are sensed using the calibrated integration time to generate data results. A codeword stored in the set of the memory cells is decoded based on the data results.

Figure 10A:
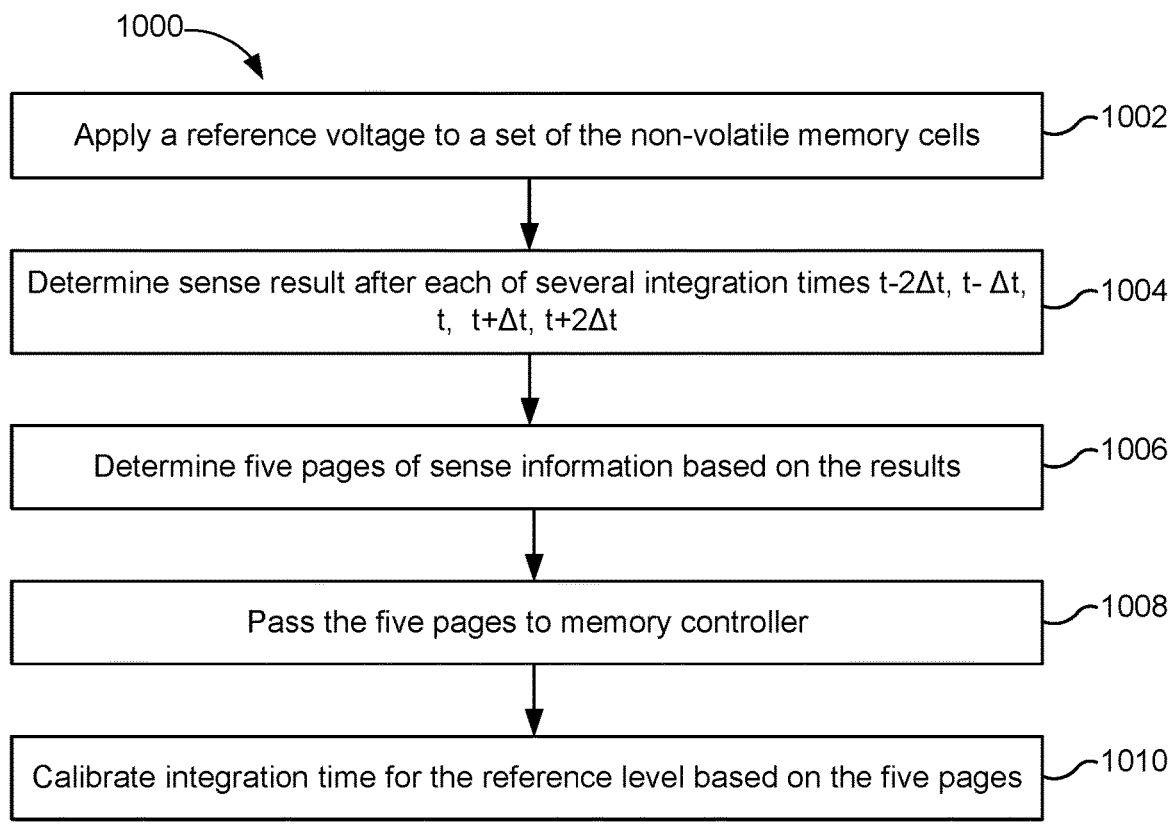
FIG. 10A depicts a flowchart of one embodiment of a process of calibrating an integration time for a reference voltage.

FIG. 10A depicts a flowchart of one embodiment of a process 1000 of calibrating an integration time for a reference voltage. Process 1000 provides further details for one embodiment of process 900. In process 1000, an integration time is determined for one reference voltage. In one embodiment, process 1000 is used when using a BES to calibrate the integration times. However, process 1000 is not limited to using a BES to calibrate the integration times.

Step 1002 includes applying a reference voltage to a set of non-volatile memory cells. In one embodiment, the reference voltage is applied to a selected word line connected to control gates of the memory cells. With reference to FIG. 8 as an example, the reference voltage could be any of Vr1-Vr15. Reference voltage Vr4 will be used as an example to discuss process 1000. Step 1002 is one embodiment of step 902.

Step 1004 includes determining a read result after each of several integration times t−2Δt, t−Δt, t, t+Δt, t+2Δt. In this example, there are five different integration times, but there could be more or fewer than five. In this example, the integration times are separated by the same time (Δt); however, this does not need to be the case. Using five different integration times with the same reference voltage may be equivalent to using the same integration time to five different reference voltages. For example, using five different integration times with Vr4 may be equivalent to applying Vr4−2Δv, Vr4−Δv, Vr4, Vr4+Δv, and Vr4+2Δv using the same integration time. However, using five different integration times with Vr4 can be performed much faster than applying Vr4−2Δv, Vr4−Δv, Vr4, Vr4+Δv, and Vr4+2Δv using the same integration time. The latter example will charge the selected word line to one of the reference voltages, followed by sensing for the integration time. Hence, the selected word line will be charged up five times—each time followed by sensing for the integration time. In step 1004, the selected word line only needs to be charged up once, followed by sensing for the integration time five times. Not having to charge the selected word line multiple times provides for considerable time savings. The amount of time savings will depend on factors such as capacitive coupling between the selected word line and neighboring conductive elements. Hence, the time savings will vary depending on the architecture. The time to sense the memory cells in step 1004 can be cut in half or even further reduced relative to applying multiple reference voltages.

Step 1006 includes determining five pages of sense information based on the results from step 1004. Each page corresponds to sensing using one of the integration times. Each page contains one bit per memory cell. For example, each page may indicate, for each memory cell, the result determined by the comparison circuit 466 in response to discharging the sense node 464 for the integration time.

Step 1008 includes passing the five pages of sense information to the memory controller 102. In one embodiment, the memory die 300 performs steps 1002-1008. For example, control circuitry 310 on the memory die 300 may perform steps 1002-1008. In one embodiment, the control die 304 performs steps 1002-1008. Steps 1004-1008 are one embodiment of step 904.

Figure 12:
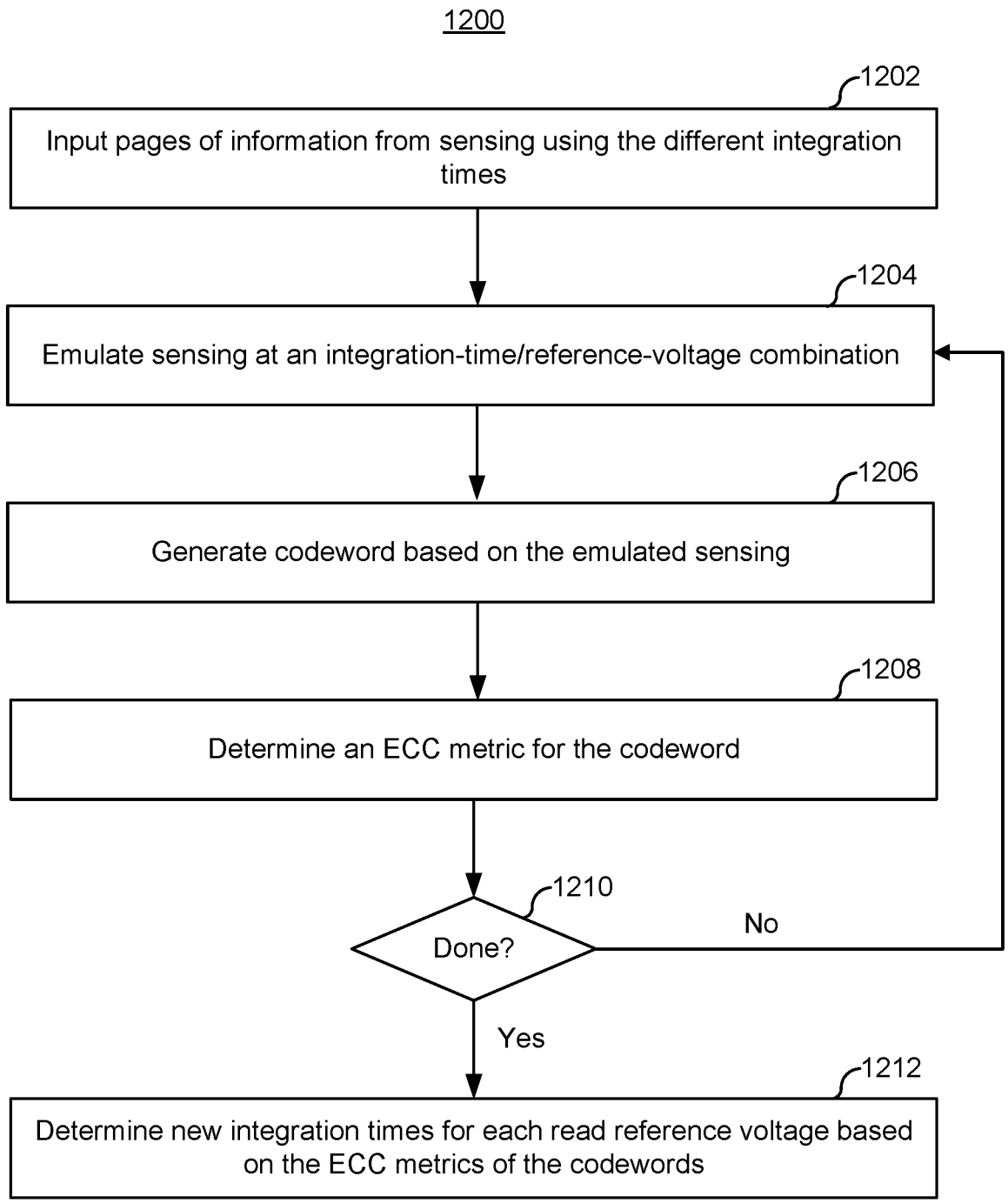
FIG. 12 depicts a flowchart of one embodiment of a process of calibrating integration times based on a BES.

Step 1010 includes calibrating the integration time for the reference level based on the five pages of information. In one embodiment, a BES is used in step 1010. Further details of a BES are depicted in FIG. 12. In one embodiment, the memory controller 102 performs step 1010. In one embodiment, the control die 304 does not send the pages to the memory controller 102, in which case the control die 304 will also perform step 1010. Step 1010 is one embodiment of step 906.

Process 1000 could be repeated to calibrate integration times for other reference voltages. The other reference voltages could be for the same page (e.g., lower page) or a different page (e.g., upper page, etc.).

Figure 10B:
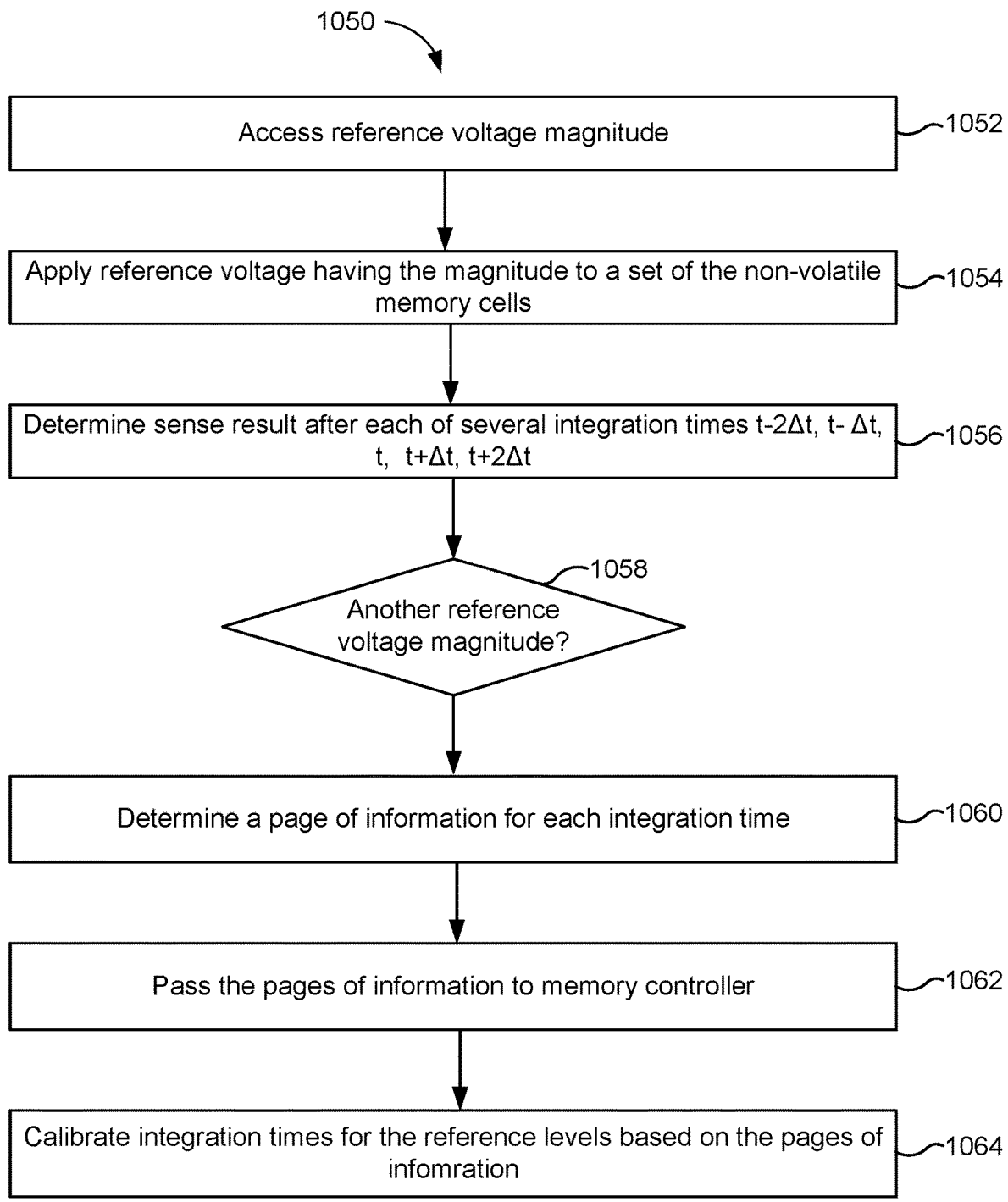
FIG. 10B depicts a flowchart of one embodiment of a process of calibrating integration times for reference voltages.

FIG. 10B depicts a flowchart of one embodiment of a process 1050 of calibrating integration times for multiple reference voltages. In process 1050, an integration time is determined for each of multiple reference levels. In some embodiments, an integration time is determined for each reference level that is used for sensing a page. An example will be discussed in which an integration time is calibrated for each of Vr1, Vr4, Vr6, and Vr11 (see, FIG. 8B). Process 1050 provides further details for one embodiment of process 900. In one embodiment, process 1050 is used when using a BES to calibrate the integration times. However, process 1050 is not limited to using a BES to calibrate the integration times.

Step 1052 includes accessing a reference voltage magnitude. Step 1054 includes applying the reference voltage to a set of non-volatile memory cells. In one embodiment, the reference voltage is applied to a selected word line connected to control gates of the memory cells. Steps 1052-1054 are one embodiment of step 902.

Step 1056 includes determining a sense result after each of several integration times t−2Δt, t−Δt, t, t+Δt, t+2Δt. In this example, there are five different integration times, but there could be more or fewer than five. This may be similar to step 1004. Thus, the sense result for each integration may indicate, for each memory cell, the result determined by the comparison circuit 466 in response to discharging the sense node 464 for the integration time. Hence, there are five sets of sense results in this example.

Step 1058 includes a determination of whether there is another reference voltage to consider. If so, the magnitude of the next reference voltage is accessed at step 1052, and applied at step 1054. Additional sets of sense results is determined in step 1056. After sense results for all reference voltages have been determined, the process continues at step 1060.

Step 1060 includes determining a page of information for each integration time. Each page contains one bit for each memory cell. Thus, if there are five integration times, then there will be five pages of information. In one embodiment, the page of information for an integration time may be determined in a similar manner as determining a page when reading at reference voltages for a page. For example, reading a lower page of data may include reading at Vr1, Vr4, Vr6, and Vr11, to produce a result for each memory cell for each read reference voltage. Logical operations may be performed on these results to generate one page of data (i.e., one bit per memory cell). This one bit per memory cell indicates whether the memory cell stores a "1" or a "0" for the lower page. Conceptually, the integration time of "t" can be thought of as corresponding to this process that determines the lower page of data. In some embodiments, the same logical operations are performed on the sense results for each integration time to thereby generate a page of information for each integration time. For example, logical operations may be performed on the sense results from each reference level (e.g., Vr1, Vr4, Vr6, and Vr11) for one of the five integration times (e.g., t−2Δt) to generate a page of information for integration time t−2Δt. Conceptually, this may be thought of as determining whether each memory cell stores a "1" or "0" for the lower page given that sensing used integration time t−2Δt. Steps 1056, 1060 are one embodiment of step 904.

Step 1062 includes passing the pages of sense information to the memory controller 102. Each page corresponds to sensing using one of the integration times. Each page contains one bit per memory cell. In one embodiment, the memory die 300 performs steps 1052-1062. For example, control circuitry 310 on the memory die 300 may perform steps 1052-1062. In one embodiment, the control die 304 performs steps 1052-1062.

Step 1064 includes calibrating the integration time for each reference level based on the five pages of information. As an example, step 1064 may be used to calibrate the integration time for Vr1, the integration time for Vr4, the integration time for Vr6, and the integration time for Vr11. In one embodiment, a BES is used in step 1064. Further details of a BES are depicted in FIG. 12. In one embodiment, the memory controller 102 performs step 1064. In one embodiment, the control die 304 does not send the pages to the memory controller 102, in which case the control die 304 will also perform step 1064. Step 1064 is one embodiment of step 906.

Figure 11:
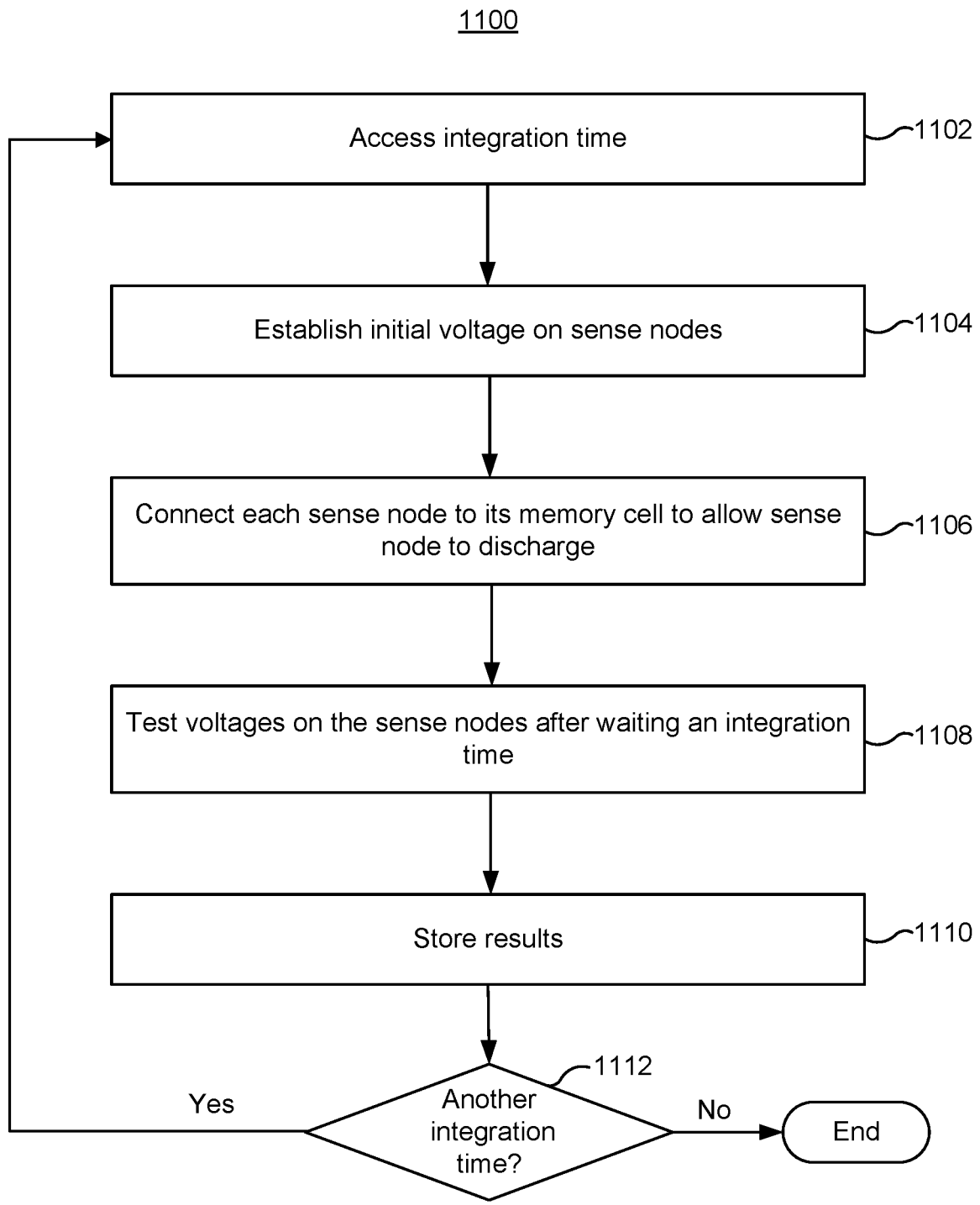
FIG. 11 depicts a flowchart of one embodiment of a process of sensing memory cells at multiple integration times while applying a reference voltage to the memory cells.

As discussed in step 904, 1004, and 1056, the memory cells are sensed at multiple integration times while applying the same reference voltage to the memory cells. FIG. 11 depicts one embodiment of a process 1100 of sensing memory cells at multiple integration times while applying a reference voltage to the memory cells. Process 1100 could be used in step 904, 1004, or 1056. Thus, process 1100 may begin after applying the reference voltage to the memory cells. Step 1102 includes accessing an integration time. This integration time is one of a set of test integration times. In one embodiment, the set is determined based the present value for the integration time for a reference voltage, and offsets (e.g., Δt) from the present value. In one embodiment, the set is fixed such that the same set is used independent of the present value for the integration time. In some embodiments, the present value for the integration time, the test set of integration times, and/or Δt is stored in storage region 326a, or storage region 318. In some embodiments, the memory controller 102 provides the set of integration times to be used in process 1100 to either the control die 304 or the memory die 300.

Step 1104 includes establishing an initial voltage on sense nodes 464 by, for example, charging the sense nodes. Recall that each memory cell may be associated with a sense amplifier 350 having a sense node 464.

Step 1106 includes connecting each memory cell to its respective sense node 464. This will allow any memory cell current to discharge the sense node 464. In some embodiments, the memory cell is connected to the sense node by way of the bit line (BL).

Step 1108 includes testing a voltage at each of the sense nodes after waiting the integration time. In other words, the memory cell current is allowed to discharge the sense node 464 for the integration time. Comparison circuit 466 may test the voltage on the sense node 464 with the trip voltage.

Step 1110 includes storing the result. In one embodiment, the result is provided to the processor 482 in the managing circuit 480. The processor 482 could store the result in one of the latches depicted in FIG. 4, a latch not depicted in FIG. 4, or provide the result to state machine 312.

Step 1112 includes determining whether there is another integration time. If so, control passes to step 1102 to access the next integration time. The process 1100 continues on by recharging the sense node 464 in step 1104, etc. Note that there is no need to alter the reference voltage that is applied to the memory cell. For example, a reference voltage that is applied to the selected word line may remain constant. Hence, there is a considerable time savings by not having to charge the selected word line to another reference voltage (as well as to wait for the voltage on the selected word line to settle down). Therefore, calibrating the integration times is both time and power efficient. The results from process 1100 may be used in step 906 (see process 900), step 1006 (see process 1000) or step 1060 (see process 1050).

As noted above, in some embodiments, integration times are calibrated based on a BES. FIG. 12 depicts a flowchart of one embodiment of a process 1200 of calibrating integration times based on a BES. Process 1200 may be used in step 906, step 1010 or step 1064. Reference will be made to the example Vt distributions in FIG. 8B to facilitate discussion of process 1200. Process 1200 may be used for the read reference voltages that are used to sense one page of data (e.g., a codeword). Process 1200 may be used to calibrate integration times for Vr1, Vr4, Vr6, and Vr11, which in one embodiment are used to sense the lower page. Process 1200 may be repeated for other pages.

Step 1202 includes inputting pages of information from sensing using the different integration times. For example, the five pages of information that were determined in process 1050 may be input. Recall that each page is for one integration time. Thus, one page may be for sensing for t−2Δt for each of Vr1, Vr4, Vr6, and Vr11, another for sensing for t−Δt for each of Vr1, Vr4, Vr6, and Vr11, another for sensing for t for each of Vr1, Vr4, Vr6, and Vr11, etc. In one embodiment, the BES is based on a set of five integration times (see FIG. 8B). In one embodiment, the BES is based on a set of seven integration times. For example, t−3Δt and t+3Δt could be added to the example in FIG. 8B.

Step 1204 includes emulating sensing at an integration-time/read-reference voltage combination. An integration-time/read-reference voltage combination may use any of the integration times for a given read reference voltage. Note that the input pages, in this example, are each for sensing at one particular integration time. However, step 1204 includes emulating sensing at different integration times for the various read reference voltages. For example, actual sensing may have been done with integration time t−2Δt for each of Vr1, Vr4, Vr6, and Vr11 in order to produce one bit for each memory cell. However, it is possible to emulate other combinations such as an emulated sensing of integration time t−2Δt for Vr1, t−Δt for Vr4, t−2Δt for Vr6, and t+Δt for Vr11. Clearly, there are a multitude of possible integration-time/reference-voltage combinations. For example, there may be a total of 5^4 possible combinations for the lower page, assuming five integrations times are used. If seven integrations times are used, there are 7^4 possible combinations for the lower page. Emulating refers to the fact that it is not required to sense using every possible combination of integration-times/reference-voltages.

Step 1206 includes generating a codeword based on the emulated sensing. The codeword refers to a codeword of data stored in the memory cells. In the present example, the codeword is for the lower page associated with sensing at Vr1, Vr4, Vr6, and Vr11. Note that a few combinations (e.g., integration time t−Δt for each of Vr1, Vr4, Vr6, and Vr11) are actually sensed. A codeword based on emulated sensing is referred to herein as an emulated codeword. Codewords based on actual sensing may also be used in step 1206. However, most of the codewords will be emulated codewords.

Step 1208 includes determining an ECC metric for the generated codeword. In one embodiment, the ECC metric is the SW. This may be the initial SW. In one embodiment, the initial SW is determined by performing one iteration of decoding in an iterative message passing decoder. In one embodiment, the ECC metric is an estimated BER. In one embodiment the BER is estimated based on the initial SW. Thus, note that the codeword need not be completely decoded in order to determine the ECC metric.

Step 1210 is a determination of whether the process is complete. One test of whether the process is complete is whether the SW is sufficiently low. The test may also be based on how many integration-time/reference-voltage combinations have been tested in process 1200. In some embodiments, a non-exhaustive search (or greedy search) is performed of a subset of the integration-time/reference-voltage combinations. In some embodiments, an exhaustive search (or comprehensive search) is performed of all of the integration-time/reference-voltage combinations.

Assuming that another codeword is to be tested, then the process returns to step 1204 to emulate sensing at another integration-time/reference-voltage combination. Process 1200 could test for hundreds or even thousands of different integration-time/reference-voltage combinations. After a sufficient number of combinations have been tested, step 1212 is performed. Step 1212 includes determining new integration times for each read reference voltage based on the ECC metrics of the codewords. In one embodiment, a codeword having the lowest SW is selected. The integration-time/reference-voltage combination associated with the selected codeword may be used for the new integration times for each reference voltage. Therefore, the integration time for each reference voltage may be calibrated. Note that the term "new integration time" does not necessarily mean that the value for the integration time is different from the previous value. Rather, the term new integration time is being used to indicate that this is the result of a calibration process which does not necessarily change every integration time.

Figure 13:
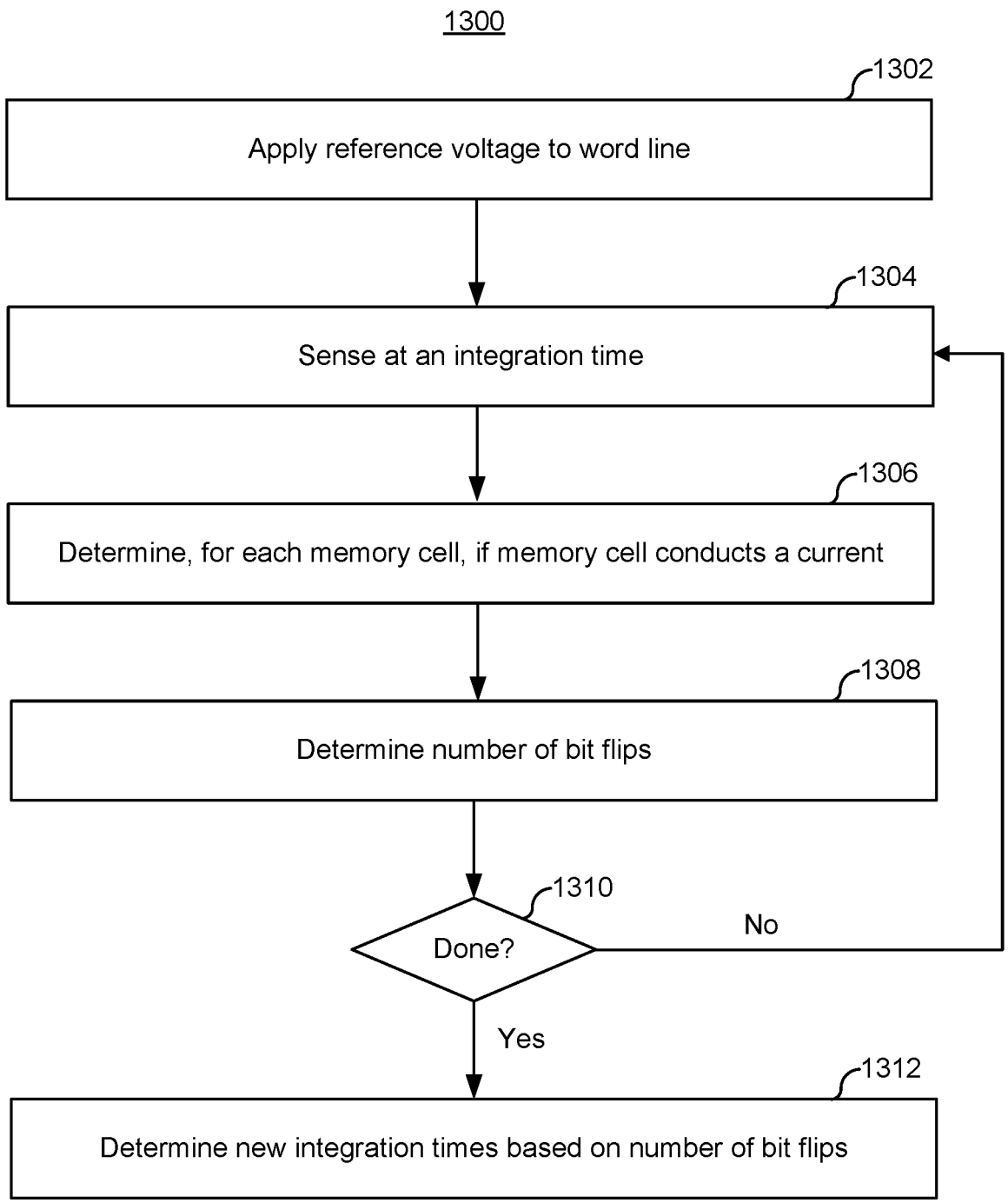
FIG. 13 depicts a flowchart of one embodiment of a process of calibrating an integration time based on a valley search.

As noted above, in some embodiments, integration times are calibrated based on a valley search. FIG. 13 depicts a flowchart of one embodiment of a process 1300 of calibrating an integration time based on a valley search. Process 1300 depicts further details of one embodiment of process 900. In one embodiment, the valley search includes reading using a set of integration times using the same read reference voltage. For example, with respect to FIG. 8B, the valley search could apply Vr4 to the memory cells, and sense at the different integration times. Step 1302 includes applying the reference voltage to the memory cells. In one embodiment, the reference voltage is applied to a selected word line. Step 1302 is one embodiment of step 902.

Step 1304 includes sensing the memory cells for an integration time. Step 1306 includes determining, for each memory cell, if the memory cell conducts a current. In one embodiment, the comparison circuit 466 compares a voltage on the sense node 464 (after the integration time) to a trip voltage Vtrip. If the sense node voltage does not decay below Vtrip, the memory cell is in a non-conductive state. Otherwise, the memory cell is in a conductive state. This result may be stored in, for example, one of the lathes (e.g., UDL, UMDL, LMDL, LDL) or elsewhere. Step 1308 includes a determination of the number of bit flips. Thus, with each integration time, the number of memory cells whose state "flips" relative to the previously used integration time can be counted. Thus, this bit flip test is not performed for the first integration time. In one embodiment, a count is made of the number of memory cells that transition from not conducting to conducting. Steps 1304-1308 are one embodiment of step 904.

Step 1310 is a test of whether there are more integration times to consider. After the number of bit flips has been determined for each integration time (relative to the previous integration time), a new integration time is selected in step 1312. The new integration time is selected as the location of the valley (see, FIG. 8B). In one embodiment, the valley is selected based on the location having the fewest such transitions. For example, the new integration time can be selected based on the fewest such transitions. Since these transitions are based on pairs of integration times, the new integration time could be either one in the pair, a midpoint of the two, etc. Other techniques may be used to perform a valley search. Step 1312 is one embodiment of step 906.

Figure 14:
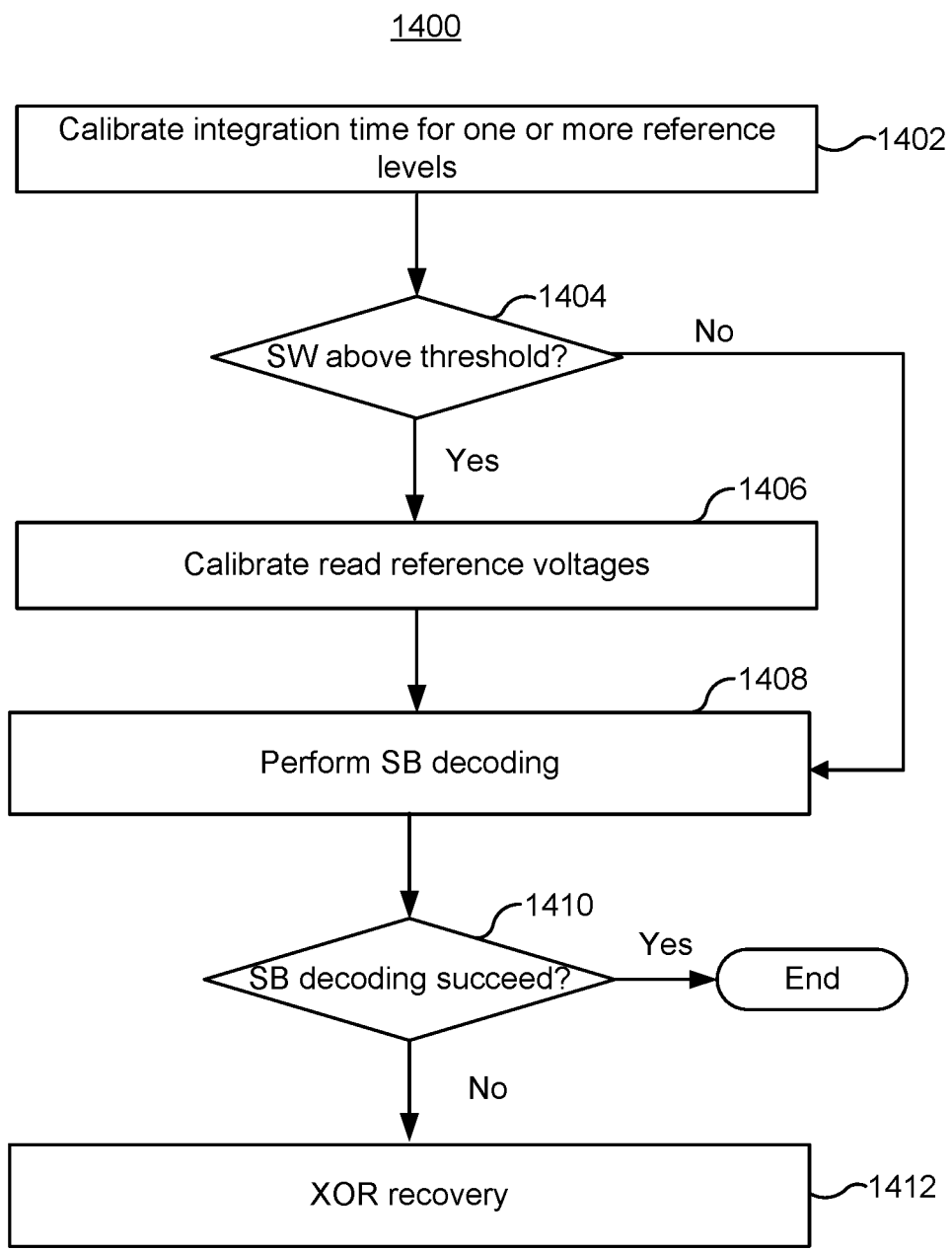
FIG. 14 depicts a flowchart of one embodiment of a process of recovering from a decoding failure, which includes calibrating integration times.

In some embodiments, integration times are calibrated in response to a failure to decode data (e.g., a codeword) read from a set of memory cells. FIG. 14 depicts a flowchart of one embodiment of a process 1400 of recovering from a decoding failure, which includes calibrating integration times. Calibrating integration times provides for considerable time savings for the recovery process. Process 1400 may be initiated in response to a failure to decode a codeword using hard bit decoding. Hard bit decoding may use hard bits that are determined by reading at hard bit reference levels. For example, with reference to FIG. 8B, memory cells may be sensed at hard bit reference levels Vr1, Vr4, Vr6, and Vr11 to generate a hard bit for each memory cell.

Step 1402 includes calibrating the integration time for one or more reference levels. For example, the integration time for one or more of Vr1, Vr4, Vr6, and/or Vr11 is calibrated. Process 900, 1000, or 1050 could be used in step 1402. As will be discussed more fully below, calibrating integration times can produce a metric such as SW.

Step 1404 is a determination of whether the SW from the integration time calibration process is above a threshold. It is desirable to have a lower SW. If the SW is below a threshold, then the process continues with soft bit (SB) decoding, at step 1408.

However, if the SW is above a threshold, then the read reference voltages are calibrated in step 1406. Calibrating the read reference voltages refers to determining new voltage magnitudes for the read reference voltages. For example, new voltage magnitudes may be determined for Vr1, Vr4, Vr6, and/or Vr11. Note that calibrating voltage magnitudes is different, and typically more time consuming, than calibrating integration times for the read reference voltages. Any technique may be used to calibrating the read reference voltages. In one embodiment, calibrating the read reference voltages is based on a search for a valley between to Vt distributions. In one embodiment, calibrating the read reference voltages is based on a BES.

Step 1408 includes performing SB decoding. Soft bit decoding involves sensing at soft bit reference levels, which may be used to indicate the reliability of the hard bits. Improved error correction capability may be achieved by decoding data using soft bits. Soft bits are derived from sensing the memory cells at a set of "soft bit reference levels." Soft bits can indicate reliability of a hard bit for each memory cell. To illustrate, soft bits may be used with ECC (Error Correcting Codes) decoding to enhance error correction capability in non-volatile memory systems that may experience memory cell errors and internal transmission errors. For example, improved error correction capability may be achieved by using low-density parity-check (LDPC) codes, and including soft bit values, as inputs to a decoder as compared to a decoding scheme that is based on using hard bits only.

The soft bit reference voltages are reference voltages at slightly higher voltages and slightly lower voltages that a corresponding hard bit reference voltage. The set of soft bit reference voltages are used to generate "soft" reliability information, which increases the correction capability of the decoder. Sensing at the soft bit reference voltages generates "soft-bits", which indicate whether the physical parameter (e.g., Vt, resistance) of a memory cell close to the hard bit reference level making the hard bit for that memory cell less reliable, or far from the hard bit reference level making the hard bit more reliable. In other words, if the soft reliability information indicates that a memory cell has its value for a physical parameter close to the hard bit reference level, then this is considered less reliable than if the soft reliability information indicates that a memory cell has its value for a physical parameter far from the hard bit reference level.

Step 1410 is determination of whether the SB decoding was successful. If so, then the process concludes. The data may be returned to the host 120. Otherwise step 1412 is performed to use XOR recovery. In an embodiment, the XOR engines 224/254 are used to perform the XOR recovery.

Figure 15:
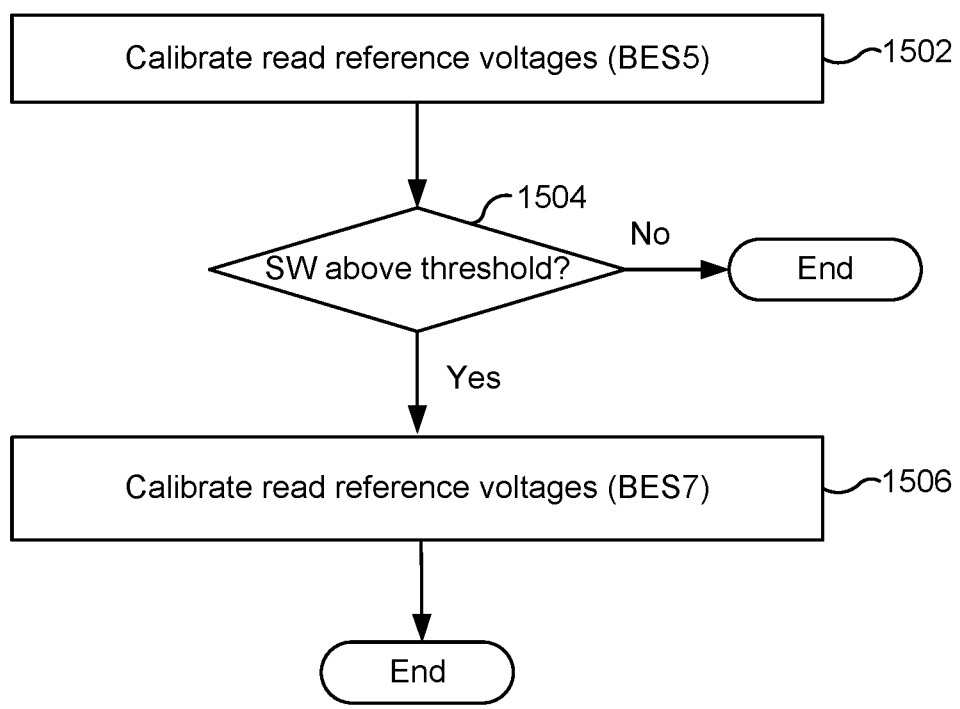
FIG. 15 depicts a flowchart of one embodiment of a process of calibrating read reference voltages.

FIG. 15 depicts a flowchart of one embodiment of a process 1500 of calibrating read reference voltages. Process 1500 is one embodiment of step 1406. Step 1502 includes calibrating read reference voltages used a BES5 technique. The BES5 technique senses the memory cells at five locations close to each hard bit reference voltage for the page being processed. With reference to FIG. 8A, the memory cell may be sensed at the five voltages (e.g., Vr1−2Δv, Vr1−Δv, Vr1, Vr1+Δv, Vr1+2Δv) for the five locations close to Vr1. Similar sensing may be performed at five locations close to Vr4, Vr6, and Vr11. The BES5 process determine an error metric for codewords derived from the sensing. The error metric may be, for example, a syndrome weight or a bit error rate (BER).

Step 1504 is a determination of whether the SW is above a threshold. The SW refers to a SW of codewords that are analyzed in the BES5 process. The SW could be the lowest SW of the codewords, which corresponds to the new read levels determined by the BES5 process. If the SW is below the threshold, then the process concludes. If the SW is above the threshold, then a BES7 technique is used to calibrate read reference voltages in step 1506. A BES7 technique uses seven locations close to each hard bit reference voltage for the page being processed. With reference to FIG. 8A, the memory cell may be sensed at the five voltages (e.g., Vr1−2Δv, Vr1−Δv, Vr1, Vr1+Δv, Vr1+2Δv), plus two additional voltages Vr1−3Δv, Vr1+3Δv. After the read reference voltages are calibrated, SB decoding may be performed (see step 1408 in FIG. 14).

Figure 16:
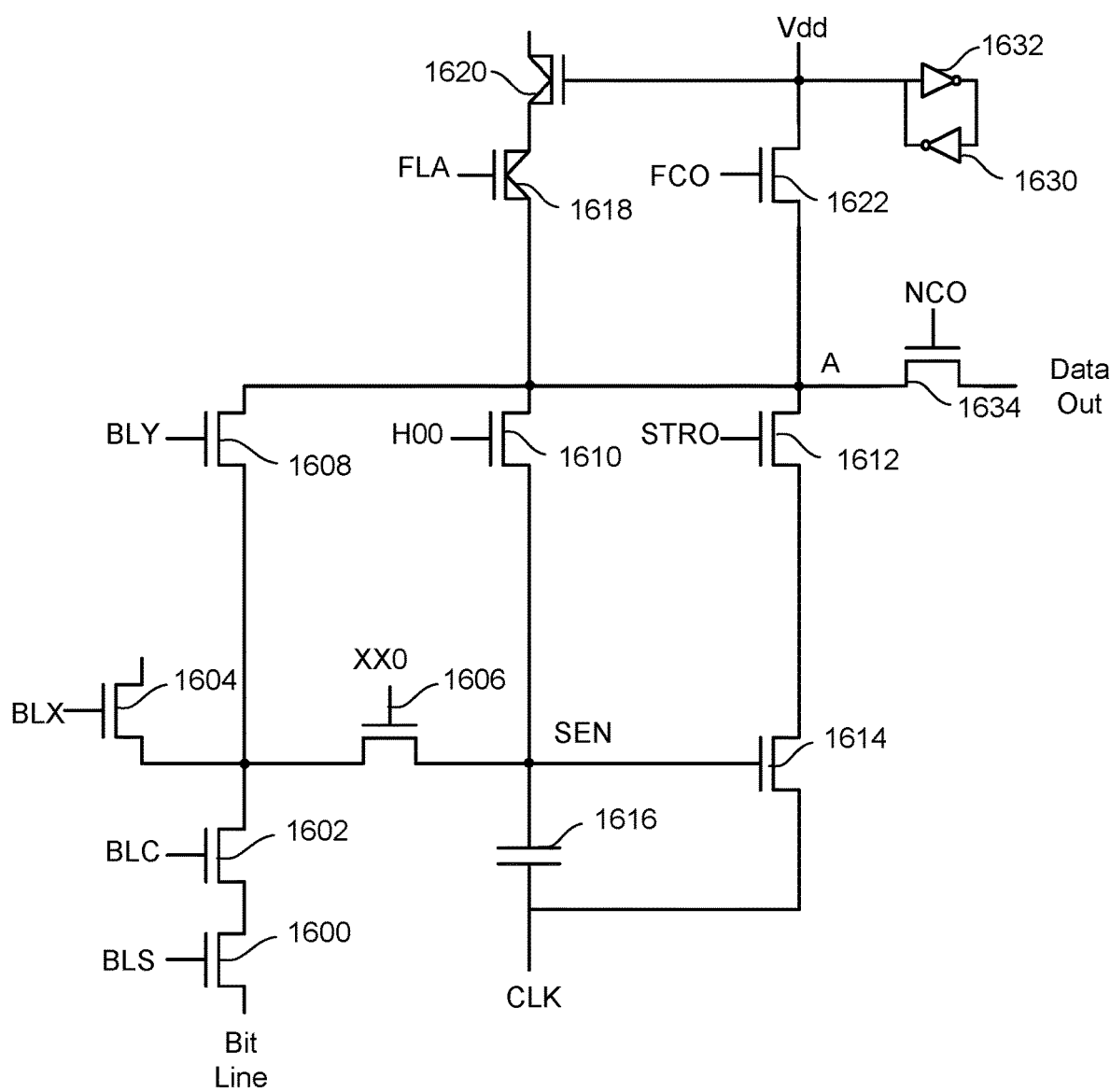
FIG. 16 is a schematic diagram depicting a circuit of a sense amplifier 350 of FIG. 4.
Figure 17:
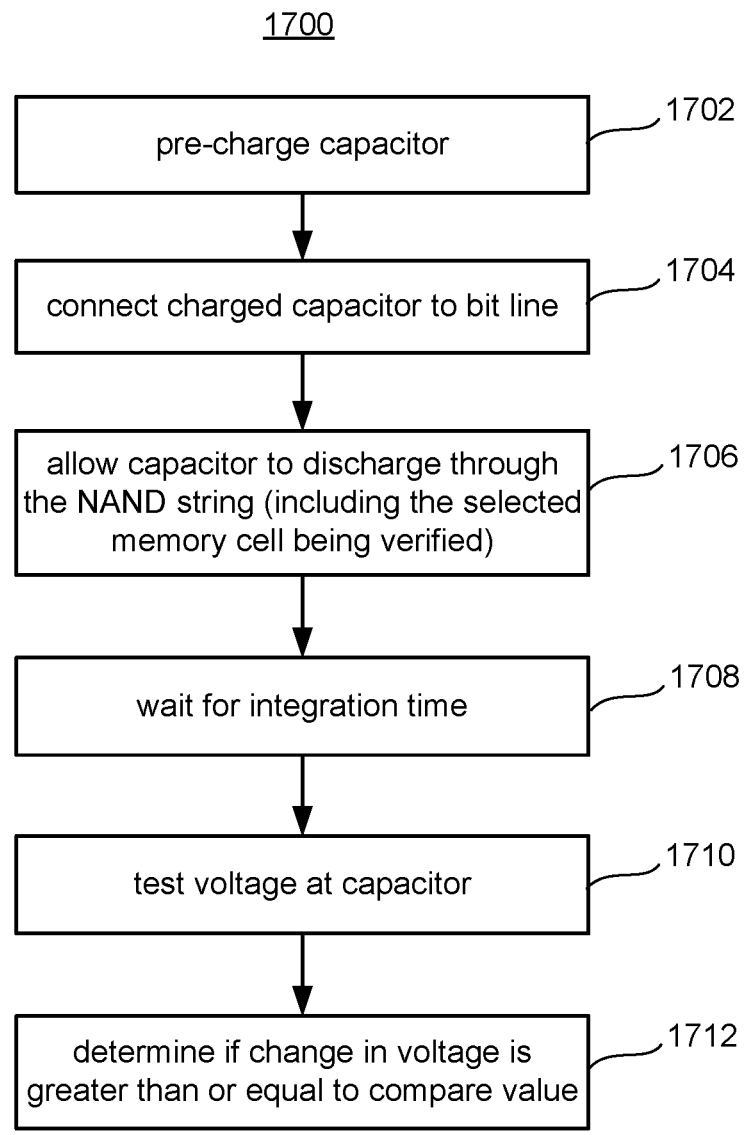
FIG. 17 is a flowchart describing one embodiment for sensing current through the memory cell.
Figure 18:
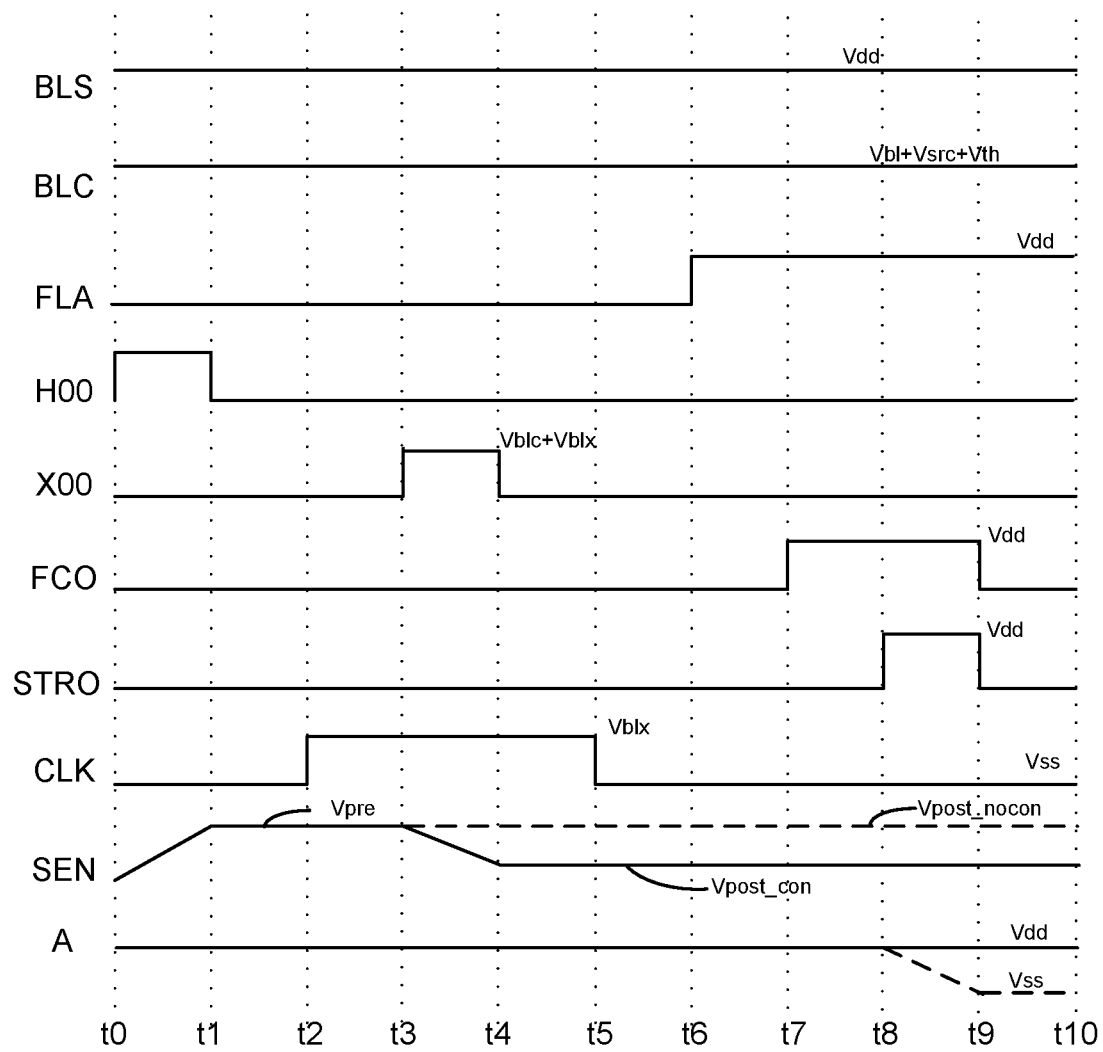
FIG. 18 is a timing diagram describing the behavior of various signals from FIG. 16.

FIGS. 16-18 provide further details of embodiments of sensing memory cells using different integration times. FIG. 16 is a schematic diagram depicting a circuit from a sense amplifier 350 (see FIG. 4). As described below, the circuit of FIG. 16 will pre-charge a capacitor (or other charge storage device) to a pre-charge magnitude (or initial voltage), discharge the capacitor through the memory cell for an integration time, and sense a voltage at the capacitor after the integration time. Although FIG. 16 features one capacitor, in some embodiments, any suitable charge storage device can replace or complement this capacitor. The sense voltage will be indicative of whether the memory cell conducted the current being sensed for, which is indicative of whether the threshold voltage of the memory cell is greater than or less than threshold voltage being tested for.

FIG. 16 shows transistor 1600 connected to the Bit Line and transistor 1602. Transistor 1600 receives the signal BLS at its gate, and is used to connect to or isolate the Bit Line. Transistor 1602 receives the signal BLC at its gate, and is used as a voltage clamp. The gate voltage BLC is biased at a constant voltage equal to the desired Bit Line voltage plus the threshold voltage of transistor 1602. The function of transistor 1602, therefore, is to maintain a constant Bit Line voltage during a sensing operation (during read or verify), even if the current through the Bit Line changes.

Transistor 1602 is connected to transistors 1604, 1606 and 1608. Transistor 1606 is connected to capacitor 1616. The purpose of transistor 1606 is to connect capacitor 1616 to Bit Line and disconnect capacitor 1616 from Bit Line so that capacitor 1616 is in selective communication with Bit Line. In other words, transistor 1606 regulates the integration time mentioned above with respect to steps 904, 1004, 1056, 1102. That is, while transistor 1606 is turned on capacitor 1616 can discharge through the Bit Line, and when transistor 1606 is turned off capacitor 1616 cannot discharge through the Bit Line.

The node at which transistor 1606 connects to capacitor 1616 is also connected to transistor 1610 and transistor 1614. Transistor 1610 is connected to transistors 1608, 1612 and 1618. Transistor 1618 is also connected to transistor

1620. Transistors 1618 and 1620 are PMOS transistors while the other transistors of FIG. 16 are NMOS transistors. Transistors 1610, 1618, and 1620 provide a pre-charging path to capacitor 1616. A voltage (e.g. Vdd or other voltage) is applied to the source of transistor 1620. By appropriately biasing transistors 1610, 1618 and 1620, the voltage applied to the source of transistor 1620 can be used to pre-charge capacitor 1616. After pre-charging, capacitor 1616 can discharge through the Bit Line via transistor 1606 (assuming that transistors 1600 and 1602 are conducting).

The circuit of FIG. 16 includes inverters 1630 and 1632 forming a latch circuit. The output of inverter 1632 is connected to the input of inverter 1630 and the output of inverter 1630 is connected to the input of inverter 1632, as well as transistors 1620 and 1622. The input of inverter 1632 will receive Vdd and the two inverters 1630, 1632 will act as a latch to store Vdd. The input of inverter 1632 can also be connected to another value. Transistors 1612 and 1622 provide a path for communicating the data stored by inverters 1630 and 1632 to transistor 1614. Transistor 1622 receives the signal FCO at its gate. Transistor 1612 receives the signal STRO at its gate. By raising or lowering FCO and STRO, a path is provided or cut off between the inverters 1630, 1632 and transistor (sensing switch) 1614. The gate of transistor 1614 is connected capacitor 1616, transistor 1606 and transistor 1610 at the node marked SEN. The other end of capacitor 1616 is connected to the signal CLK.

As discussed above, capacitor 1616 is pre-charged via transistors 1610, 1618 and 1620. This will raise the voltage at the node SEN to a pre-charge voltage level (Vpre). When transistor 1606 turns on, capacitor 1616 can discharge its charge through the Bit Line and the selected memory cell if the threshold voltage of the memory cell is below the voltage level being tested for. If the capacitor 1616 is able to discharge, then the voltage at the capacitor (at the SEN node) will decrease.

The pre-charge voltage (Vpre) at the SEN node is greater than the threshold voltage of transistor 1614; therefore, prior to the integration time, transistor 1614 is on (conducting). Since transistor 1614 is on during the integration time, then transistor 1612 should be off. If the capacitor does not discharge during the integration time, then the voltage at the SEN node will remain above the threshold voltage of transistor 1614 and the charge at the inverters 1630, 1632 can be discharged into the CLK signal when STRO turns on transistor 1612. If the capacitor discharges sufficiently during the integration time, then the voltage at the SEN node will decrease below the threshold voltage of transistor 1614; thereby, turning off transistor 1614 and the data (e.g., Vdd) stored at inverters 1630, 1632 from being discharged through CLK. So testing whether the inverters 1630, 1632 maintain their charge or discharge will indicate the result of the verification process. In one embodiment, the result can be read at node A via transistor 1634 (Data Out) by turning on transistor 1634 gate signal NCO.

The pre-charge level of capacitor 1616 (and, thus, the pre-charge voltage at node SEN) is limited by the current passing through transistor 1610. The current that passes through transistor 1610 is limited by the gate voltage H00. As such, the pre-charge voltage at node SEN is limited by the voltage H00 less the threshold voltage of transistor 1610. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a sense operation (during, for example, integration time calibration), the voltage applied to the control gate of the memory cell may cause the channel (connected to the bit line) of the cell to conduct. If this happens, a capacitor is discharged through the channel, lowering in voltage as it discharges.

FIG. 17 is a flowchart describing one embodiment of a process 1700 for sensing current through the memory cell. The process of FIG. 17 can be executed by the circuit of FIG. 16. The embodiment of FIG. 17 assumes a structure in which a charge storage device will discharge its charge through the selected memory cell in order to detect current. One example of such a structure is depicted at least in part by FIG. 16, as described above. In the example of FIG. 16, the charge storage device 1616 comprises a capacitor. However, in other embodiments, other types of charge storage devices can also be used.

In step 1702 of FIG. 17, the capacitor (or other charge storage device) will be pre-charged to a pre-determined voltage level. In step 1704, the pre-charged capacitor (or other charge storage device) will be connected to the bit line. In step 1706, the capacitor will be allowed to discharge its charge through the bit line and NAND string (including the selected memory cell being verified). The system will wait for the integration time in step 1708. At the conclusion of the integration time (step 1710), the system (e.g., comparison circuit 466) will test the voltage across the capacitor. The system will calculate the change in voltage across the capacitor from the pre-charge voltage to the voltage detected in step 1710. In step 1712, this calculated change in voltage is compared to a compare value. For example, comparison circuit 466 compares the voltage on the sense capacitor to a trip voltage. If the change in voltage is greater than or equal to the compare value, then it is assumed that the memory cell conducted current greater than the current level being sensed for.

FIG. 18 is a timing diagram describing the behavior of various signals from FIG. 16. The signal BLS is at Vdd the entire time depicted and the signal BLC is at Vbl+Vsrc+Vth, where Vbl is the voltage of the Bit Line, Vsrc is the voltage of the source line and Vth is the threshold voltage of transistor 1602. The signal FLA starts at Vss at t0 and goes to Vdd at T6. When the signal FLA is at Vss, the pre-charging path is regulated by transistor 1610. At t0, the voltage of H00 is raised to a pre-charge level. The raising of the voltage at H00 turns on transistor 1610 and opens up the pre-charge path. The magnitude of the voltage at H00 is set. While H00 is high, transistor 1610 turns on and capacitor 1616 will pre-charge between T0 and T1, as depicted by the voltage at SEN (depicted second from the bottom on FIG. 24). At time t1, H00 is brought down to Vss and the pre-charging is completed.

The signal X00 is used to allow capacitor 1616 to be in communication with the Bit Line so that the capacitor can discharge through the Bit Line and selected memory cell. At time t3, X00 is raised to Vblc+Vblx, where Vblc is the voltage of the signal BLC and Vblx is the voltage of the signal BLX (both discussed above). At time t4, the voltage at X00 is lowered to Vss. Between times t3 and t4, capacitor 1616 will be in communication with the Bit Line in order to allow it to discharge as charged through the Bit Line and the selected memory cell (depending on the threshold voltage of the selected memory cell). The signal CLK is raised to Vblx at time t2 and lowered back down to Vss at time T5 to prevent any fighting conditions in the circuit and to allow proper discharge of capacitor 1616.

As discussed above, because H00 is raised between t0 and t1, capacitor 1616 (and SEN node) will charge up between t0 and t1 (the pre-charge). This is depicted in FIG. 18 with the SEN node charging from Vss to Vpre. When X00 is raised up at t3, capacitor 1616 can discharge through the Bit Line (if the threshold voltage is at the appropriate level). As depicted in FIG. 18 between t3 and t4, Vpre will discharge to Vpost con. If the threshold voltage for the memory cell being tested is high enough, capacitor 1616 will not discharge and the voltage will remain at Vpre.

FIG. 18 shows that the signal FCO is raised to Vdd at t7 and lowered to Vss at T9. The signal STRO is raised to Vdd at t8 and lowered at t9. Between times t8 and t9, there is a path between the inverters 1630, 1632 and transistor 1614. If the voltage at the node SEN is greater than the threshold voltage of transistor 1614, then there will be a path from the inverters 1630, 1632 to CLK and the data at the inverters 1630, 1632 will dissipate through the signal CLK and through the transistor 1614. If the voltage at the node SEN is lower than threshold voltage of transistor 1614 (e.g. if the capacitor discharged), then transistor 1614 will turn off and the voltage stored by the inverters 1630, 1632 will not dissipate into CLK. FIG. 18 shows the voltage level at A at Vdd. If the voltage of the capacitor does not dissipate (e.g., due to not enough current flowing because the threshold voltage of the selected memory cell is greater than the voltage being tested for), then transistor 1614 will remain on and the voltage at node A will remain dissipate to Vss (as depicted by the dashed line). If the voltage of the capacitor does dissipate (e.g., due to sufficient current flowing because the threshold voltage of the selected memory cell is below the voltage being tested for), then transistor 1614 will turn off and the voltage at node A will remain at Vdd (as depicted by the solid line). The output of node A is provided to the Data Out signal via transistor 1634 by applying Vdd to the signal NCO.

In view of the above, it can be seen that a first embodiment includes an apparatus, comprising a communication interface and a control circuit coupled to the communication interface. The control circuit is configured to connect to non-volatile memory cells. The control circuit is configured to apply one or more reference voltages to a set of the non-volatile memory cells. The control circuit is configured to sense the set of the non-volatile memory cells for a plurality of different integration times while applying the one or more reference voltages to the set of the non-volatile memory cells to generate sensing results. The control circuit is configured to calibrate an integration time for at least one reference voltage of the one or more reference voltages based on the sensing results.

In a second embodiment, and in furtherance of the first embodiment, the control circuit is further configured to determine a bit of information for each memory cell in the set for each of the different integration times for the sensing result. The control circuit is further configured to calibrate the integration time for the at least one reference voltage based on the bit of information for each memory cell in the set for each of the different integration times.

In a third embodiment, and in furtherance of the first or second embodiments, the one or more reference voltages comprise a plurality of reference voltages for sensing a page of data. The control circuit is configured to calibrate a separate integration time for each of the plurality of reference voltages based on the sensing results.

In a fourth embodiment, and in furtherance of any of the first to third embodiments, the control circuit is configured to calibrate the integration time for the at least one reference voltage based on a bit error rate estimation scan (BES) using the sensing results.

In a fifth embodiment, and in furtherance of any of the first to fourth embodiments, the control circuit is configured to generate codewords for data stored in the set of the non-volatile memory cells based on the sensing results. The control circuit is configured to calibrate the integration time for the at least one reference voltage based on an error metric of each of the codewords.

In a sixth embodiment, and in furtherance of the fifth embodiment, the control circuit is configured to emulate sensing for a plurality of integration-time/reference-voltage combinations based on the sensing results. The control circuit is configured to generate the codewords based on the emulating sensing for the plurality of integration-time/reference-voltage combinations.

In a seventh embodiment, and in furtherance of any of the first to sixth embodiments, the control circuit is configured to search for a valley between two threshold voltage distributions based on the sensing results. The control circuit is configured to calibrate the integration time for a first reference voltage of the one or more reference voltages based on a location of the valley.

In an eighth embodiment, and in furtherance of any of the first to seventh embodiments, to sense the set of the non-volatile memory cells for the plurality of different of integration times while applying the one or more reference voltages to the set of the non-volatile memory cells, the control circuit is configured to, for each memory cell in the set and for each integration time: establish an initial voltage on each of a plurality of sense nodes, each sense node is associated with one of the memory cells; connect each sense node to the associated memory cell after establishing the initial voltages on the sense nodes; and detect a voltage on each sense node after waiting for the integration time after connecting the sense nodes to the associated memory cells.

In a ninth embodiment, and in furtherance of any of the first to eighth embodiments, the control circuit is configured to calibrate the integration time for the at least one reference voltage in response to failing to decode a codeword read from the set of the memory cells. The control circuit is configured to recover the codeword based on sensing the memory cells using the integration time for the at least one reference voltage.

In a tenth embodiment, and in furtherance of any of the first to ninth embodiments, the control circuit is further configured to: apply the one or more reference voltages to the set of the non-volatile memory cells after calibrating the integration time for the at least one reference voltage; sense the set of the memory cells using the calibrated integration time for the at least one reference voltage to generate data results; and decode a codeword stored in the set of the memory cells based on the data results.

One embodiment includes a method comprising: applying a set of reference voltages to a word line connected to a group of non-volatile memory cells; sensing the group of the non-volatile memory cells for a plurality of different of integration times while applying each reference voltage in the set of reference voltages to the word line to generate sensing results; generating codewords for data stored in the group of the non-volatile memory cells based on the sensing results; and calibrating an integration time for each reference voltage in the set of reference voltages based on error metrics for the codewords.

One embodiment includes a non-volatile storage system, comprising non-volatile memory cells; a word line connected to the memory cells; a plurality of bit lines, each of the bit lines associated with one of the memory cells; a power control module configured to provide a reference voltage to the word line; means for sensing the memory cells for a plurality of integration times while the reference voltage is applied to the word line to generate sensing results for each integration time of the plurality of integration times; and means for calibrating an integration time for the reference voltage based on the sensing results for each integration time.

In embodiments, the means for sensing the non-volatile memory cells for a plurality of integration times while the reference voltage is applied to the word line to generate sensing results for each integration time of the plurality of integration times comprises one or more of state machine 312, address decoders 314, power control 316, read/write circuits 328, sense block 340, sense amplifiers 350, latches 360, sense circuitry 460, and/or managing circuit 480. In embodiments, the means for sensing the non-volatile memory cells for a plurality of integration times while the reference voltage is applied to the word line to generate sensing results for each integration time of the plurality of integration times comprises performs one or more of process 1100, process 1700, and/or steps 1304-1308 of process 1300.

In embodiments, the means for calibrating an integration time for the reference voltage based on the sensing results for each integration time comprises a processor, PGA (Programmable Gate Array, FPGA (Field Programmable Gate Array), ASIC (Application Specific Integrated Circuit), integrated circuit or other type of circuit. In embodiments, the means for calibrating an integration time for the reference voltage based on the sensing results for each integration time comprises one or more of state machine 312, processor 220, processor 250, an/or memory processor 156. In one embodiment, the means for calibrating an integration time for the reference voltage based on the sensing results for each integration time performs process 1200.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a communication interface; and
a control circuit coupled to the communication interface, wherein the control circuit is configured to connect to non-volatile memory cells, wherein the control circuit is configured to:
apply one or more reference voltages to a set of the non-volatile memory cells;
sense the set of the non-volatile memory cells for a plurality of different integration times while applying the one or more reference voltages to the set of the non-volatile memory cells to generate sensing results;
determine a bit of information for each memory cell in the set for each of the different integration times for the sensing results; and
calibrate an integration time for at least one reference voltage of the one or more reference voltages based on the bit of information for each memory cell in the set for each of the different integration time.

2. The apparatus of claim 1, wherein the control circuit is configured to calibrate the integration time for the at least one reference voltage based on a bit error rate estimation scan (BES) using the sensing results.

3. The apparatus of claim 1, wherein the control circuit is configured to:
generate codewords for data stored in the set of the non-volatile memory cells based on the sensing results; and
calibrate the integration time for the at least one reference voltage based on an error metric of each of the codewords.

4. The apparatus of claim 3, wherein the control circuit is configured to:
emulate sensing for a plurality of integration-time/reference-voltage combinations based on the sensing results for a plurality of the one or more reference voltages; and
generate the codewords based on the emulating sensing for the plurality of integration-time/reference-voltage combinations.

5. The apparatus of claim 1, wherein:
the one or more reference voltages comprise a plurality of reference voltages for sensing a page of data; and
the control circuit is configured to calibrate a separate integration time for each of the plurality of reference voltages based on the sensing results.

6. The apparatus of claim 1, wherein to sense the set of the non-volatile memory cells for the plurality of different integration times while applying the one or more reference voltages to the set of the non-volatile memory cells, the control circuit is configured to, for each memory cell in the set and for each integration time:
establish an initial voltage on each of a plurality of sense nodes, each sense node is associated with one of the memory cells;
connect each sense node to the associated memory cell after establishing the initial voltages on the sense nodes; and
detect a voltage on each sense node after waiting for the integration time after connecting the sense nodes to the associated memory cells.

7. The apparatus of claim 1, wherein the control circuit is configured to:
calibrate the integration time for the at least one reference voltage in response to failing to decode a codeword read from the set of the memory cells; and
recover the codeword based on sensing the memory cells using the integration time for the at least one reference voltage.

8. The apparatus of claim 1, wherein the control circuit is further configured to:
apply the one or more reference voltages to the set of the non-volatile memory cells after calibrating the integration time for the at least one reference voltage;
sense the set of the memory cells using the calibrated integration time for the at least one reference voltage to generate data results; and
decode a codeword stored in the set of the memory cells based on the data results.

9. A method comprising:
applying a set of reference voltages to a word line connected to a group of non-volatile memory cells;

sensing the group of the non-volatile memory cells for a plurality of different of integration times while applying each reference voltage in the set of reference voltages to the word line to generate sensing results;

generating codewords for data stored in the group of the non-volatile memory cells based on the sensing results, including determining a page of information for each of the different integration times based on the sensing results, wherein the page of information comprises a bit for each memory cell in the group; and calibrating an integration time for each reference voltage in the set of reference voltages based on error metrics for the codewords, including calibrating a separate integration time for each reference voltage in the set of reference voltages based the page of information for each of the different integration times.

10. The method of claim 9, wherein generating the codewords for the data stored in the group of the non-volatile memory cells based on the sensing results comprises:

emulating sensing for a plurality of integration-time/reference-voltage combinations based on the sensing results; and generating the codewords based on the emulating sensing for the plurality of integration-time/reference-voltage combinations.

11. The method of claim 9, wherein sensing a particular memory cell of the non-volatile memory cells for the plurality of different of integration times while applying a given one of the reference voltages to the word line comprises performing the following for each integration time:

charging a sense capacitor associated with the particular memory cell to an initial voltage;

connecting the sense capacitor to the particular memory cell after charging the sense capacitor to the initial voltage to discharge the initial voltage from the sense capacitor; and testing a voltage on the sense capacitor after discharging the sense capacitor for the integration time.

12. A non-volatile storage system, comprising:

non-volatile memory cells;

a word line connected to the memory cells;

a plurality of bit lines, each of the bit lines associated with one of the memory cells;

a power control module configured to provide a reference voltage to the word line;

means for programming a set of the non-volatile memory cells to threshold voltage distributions;

means for sensing the set of the memory cells for a plurality of integration times while the reference voltage is applied to the word line to generate a sensing result for each integration time of the plurality of integration times;

means for searching for a valley between two of the threshold voltage distributions based on the sensing result for each integration time; and means for calibrating an integration time for the reference voltage based on a location of the valley.

13. The non-volatile storage system of claim 12, wherein the means for sensing the set of the memory cells for the plurality of integration times while the reference voltage is applied to the word line is configured to, for each respective integration time:

determine, for each memory cell in the set, whether the memory cell conducts a current in response to the respective integration time; and determine a number of bit flips between results for the respective integration time and results for another integration time.

14. The non-volatile storage system of claim 13, wherein the means for calibrating the integration time for the reference voltage based on the location of the valley is configured to:

calibrate the integration times based on the bit flips.

15. The non-volatile storage system of claim 12, wherein the means for sensing the set of the memory cells for the plurality of integration times while the reference voltage is applied to the word line is configured to, for each respective integration time:

charge a plurality of sense nodes to an initial voltage, wherein each sense node is associated with one of the memory cells in the set;

connect each memory cell in the set to its associated sense node to allow the memory cell to discharge the sense node for the respective integration time; and compare a voltage on each sense node with a trip voltage in response to the memory cell discharging the associated sense node for the respective integration time.

* * * * *